(12) United States Patent
Lei et al.

(10) Patent No.: US 7,897,525 B2
(45) Date of Patent: Mar. 1, 2011

(54) METHODS AND SYSTEMS OF TRANSFERRING, DOCKING AND PROCESSING SUBSTRATES

(75) Inventors: Lawrence Chung-Lai Lei, Milpitas, CA (US); Alfred Mak, Fremont, CA (US); Rex Liu, Castro Valley, CA (US); Kon Park, Livermore, CA (US); Samuel S. Pak, San Ramon, CA (US); Tzy-Chung Terry Wu, Palo Alto, CA (US); Simon Zhu, Sunnyvale, CA (US); Ronald L. Rose, San Jose, CA (US); Gene Shin, San Jose, CA (US); Xiaoming Wang, San Jose, CA (US)

(73) Assignee: Archers Inc., Gerogetown, Grand Cayman (KY)

( * ) Notice: Subject to any disclaimer, the term of this patent is extended or adjusted under 35 U.S.C. 154(b) by 0 days.

(21) Appl. No.: 12/319,231

(22) Filed: Dec. 31, 2008

(65) Prior Publication Data
US 2010/0167503 A1    Jul. 1, 2010

(51) Int. Cl.
*H01L 21/00*    (2006.01)
(52) U.S. Cl. .......................................... 438/800; 414/935
(58) Field of Classification Search .................. None
See application file for complete search history.

(56) References Cited

U.S. PATENT DOCUMENTS

| | | | | |
|---|---|---|---|---|
| 5,024,570 A | * | 6/1991 | Kiriseko et al. | 414/222.06 |
| 5,388,945 A | * | 2/1995 | Garric et al. | 414/217.1 |
| 5,536,128 A | * | 7/1996 | Shimoyashiro et al. | 414/273 |
| 5,563,520 A | * | 10/1996 | Terada | 324/754 |
| 5,892,200 A | | 4/1999 | Kendall et al. | |
| 6,099,598 A | * | 8/2000 | Yokoyama et al. | 29/25.01 |
| 6,152,669 A | * | 11/2000 | Morita et al. | 414/217 |
| 6,503,365 B1 | | 1/2003 | Kim et al. | |
| 6,533,101 B2 | * | 3/2003 | Bonora et al. | 198/465.1 |
| 6,602,038 B2 | * | 8/2003 | Ahn et al. | 414/279 |
| 6,637,998 B2 | | 10/2003 | Langan et al. | |
| 6,679,672 B1 | * | 1/2004 | Barrows | 414/217 |

(Continued)

FOREIGN PATENT DOCUMENTS

JP    5-003240 A    1/1993

(Continued)

OTHER PUBLICATIONS

International Search Report and Written Opinion, PCT/US2009/069601, Aug. 30, 2010, 15 pages.

*Primary Examiner* — Scott B Geyer
(74) *Attorney, Agent, or Firm* — Morgan, Lewis & Bockius LLP

(57) ABSTRACT

In accordance with some embodiments described herein, a method for transferring a substrate to two or more process modules is provided, comprising loading at least one substrate into one or more mobile transverse chambers, the mobile transverse chambers being carried on a rail positioned adjacent to the two or more process modules, and wherein each mobile transverse chamber is configured to maintain a specified gas condition during conveyance of the substrate. One or more drive systems are actuated to propel at least one of the one or more mobile transverse chambers along the rail. The at least one mobile transfer chamber docks to at least one of the process modules, and the substrate is conveyed from the mobile transverse chamber to the at least one process modules.

62 Claims, 20 Drawing Sheets

U.S. PATENT DOCUMENTS

| | | | |
|---|---|---|---|
| 6,808,352 B2 * | 10/2004 | Seita | 414/217.1 |
| 6,848,882 B2 * | 2/2005 | Chen et al. | 414/626 |
| 7,044,703 B2 * | 5/2006 | Fukuda et al. | 414/416.03 |
| 7,244,086 B2 | 7/2007 | Ostermann et al. | |
| 7,287,920 B2 | 10/2007 | Hayashi et al. | |
| 7,293,950 B2 * | 11/2007 | Bonora et al. | 414/217.1 |
| 7,357,842 B2 | 4/2008 | Ishikawa et al. | |
| 7,410,340 B2 * | 8/2008 | Bonora et al. | 414/217.1 |
| 2005/0105991 A1 | 5/2005 | Hofmeister et al. | |
| 2007/0231109 A1 | 10/2007 | Pak et al. | |

FOREIGN PATENT DOCUMENTS

| | | |
|---|---|---|
| JP | 2003-258077 A | 9/2003 |
| KR | 2005-0072692 A | 7/2005 |
| KR | 2007-0029032 A | 3/2007 |
| WO | WO 2007/101228 A2 | 9/2007 |
| WO | WO 2007/139896 A2 | 12/2007 |

* cited by examiner

METHODS AND SYSTEMS OF TRANSFERRING, DOCKING AND PROCESSING SUBSTRATES

TECHNICAL FIELD

The disclosed embodiments relate generally to systems and methods for processing of substrates, such as but not limited to glass and other substrates used in the solar or photovoltaic industry, and wafers used in the semiconductor industry. More particularly, some embodiments relate to systems and methods for substrate processing comprising one or more mobile transverse chambers for transporting substrates between process modules.

BACKGROUND

Fabrication of semiconductors, flat panel displays, and photovoltaics (PV) or solar cells require multiple processes, such as etching, chemical vapor deposition, sputtering and cleaning, all of which are performed on various substrates to form the desired device or product. Each of these processes may be performed using a single and distinct processing tool or module that performs a single fabrication process. Since multiple fabrication processes must be performed, substrates must be transferred from one processing tool to the next, which exposes the substrates to breakage and contamination. Further, transferring substrates between different processing tools increases the overall processing time and cost of fabrication.

A variety of process architectures are used in the industry. Traditional inline processing tools, which arrange processing tools linearly and move substrates sequentially from one processing tool to the next processing tool, are known to be inefficient, particularly when each processing tool requires different processing time as is commonly the case. For example, bottlenecks are common when substrates processed by a faster tool have to wait for their respective turn to be processed by a slower, downstream process tool.

Consequently, system architectures have been developed that provide multiple processing tools that can perform multiple fabrication processes. One commonly used example of a multiple processing tool is a cluster tool. The cluster tool employs multiple process chamber units arranged in a circular fashion typically connected to a single, large immobilized vacuum transfer chamber with one vacuum transfer robot to transfer substrates between the process chambers via multiple load lock chambers. Since substrates are transferred within a single tool for different fabrication processes, the potential for contamination is reduced. In addition, the substrates can be more quickly transferred between process chamber units, which reduces the overall processing time.

Traditional cluster tools however suffer several significant limitations. First there is a practical limit in the number of fabrication tools that may form the cluster. In order to add fabrication tools to the cluster, the transfer chamber size needs to increase to provide sufficient area to transport substrates from the transfer chamber to process chambers. This requires a long-reach transfer robot. Furthermore, adding a new tool to the cluster may require a whole new cluster tool if the capacity of the existing cluster tool is not sufficient to accommodate the new tool. Thus, the system is not easily expanded.

Second, the large immobile vacuum transfer chamber is of complex mechanical design and is not easily adapted to accommodate large substrates. For example, large glass or silicon substrates for photovoltaic or flat panel applications require a large rotating radius to turn the correspondingly large vacuum transfer chamber, and requires a large vacuum pump and expensive robot components that are rigid enough to perform such long stroke of travel.

Additionally, certain photovoltaic and semiconductor products involve processing steps of varied duration, causing significant bottlenecks in the processing line. For example, photovoltaic cells require deposition of multiple thin film layers of various thickness. Deposition of an intrinsic layer ("I-layer"), negative or n-doped layer ("N-layer"), and positive or p-doped layer ("P-layer") often require significantly different deposition time to achieve the desired thickness. When deposition of a layer requiring short deposition time is followed by deposition of a layer requiring a long deposition time, the second layer creates a bottleneck and limits the throughput especially in a sequential or inline manufacturing process. The fabrication of multi-junction photovoltaic cells further magnifies the problem.

Accordingly, further improvements are needed.

SUMMARY

In general, embodiments disclosed herein relate to systems and methods for processing of substrates, such as but not limited to glass and other substrates used in the solar or photovoltaic industry, and wafers used in the semiconductor industry. More particularly, some embodiments disclosed herein relate to systems and methods for substrate processing comprising one or more mobile transverse chambers for transporting substrates between process modules.

In some embodiments a system for processing substrates is provided, comprising: one or more mobile transverse chambers configured to move between two or more process modules and to convey one or more substrates to at least one of two or more process modules. Each mobile transverse chamber is configured to independently maintain a specified gas condition during movement between process modules and during conveyance of the one or more substrates to the process modules.

In another embodiment, a system for processing substrates is provided, comprising: two or more process modules, each process module comprising a process chamber for processing the substrates; a substrate handling robot; a load lock chamber configured to receive the substrates from the substrate handling robot; and a transverse substrate handler configured to receive the substrates from the load lock chamber and transfer the substrates to at least one of the two or more process modules. The transverse substrate handler typically includes one or more mobile transverse chambers configured to move between the two or more process modules and to convey one or more substrates to at least one of the two or more process modules. Of particular advantage each mobile transverse chamber is configured to maintain a specified gas condition during movement between the process modules and during conveyance of the one or more substrates.

The system may be configured as a single line or in-line system, meaning that the transverse substrate handler and process modules are placed in a linear line fashion and the mobile transverse chamber(s) move linearly along the rail. Additionally, two parallel or dual in-line systems may be provided and optionally each line may be of different length. Further, the mobile transverse chamber(s) may service process modules positioned adjacent opposite sides of the mobile transverse chamber. Unlike inline systems of the prior art, the present invention provides flexibility, reduces bottlenecks and increases throughput, as described in more detail below. Many other types of arrangements are possible. For example and without limitation, the system may alternatively be configured as a cluster-type system, where the process modules and transverse substrate handler are positioned in a circular, U-shaped or other type of arrangement. Even further, the system may employ stacked process modules and an associated stacked transverse substrate handler. Thus, while certain specific embodiments are shown and described herein, those of skill in the art will recognize that various other system layouts and arrangement are possible and fall with the spirit and scope of the present invention.

In accordance with some embodiments described below, a system for processing substrates includes two or more process modules, a substrate handling robot, a load lock chamber, and a transverse substrate handler configured to receive the substrates from the load lock chamber and transfer the substrates to at least one of the two or more process modules. Each process module includes a process chamber for processing the substrates. The load lock chamber is configured to receive the substrates from the substrate handling robot. The transverse substrate handler includes one or more mobile transverse chambers configured to convey one or more substrates to at least one of the two or more process modules. Each mobile transverse chamber is configured to independently maintain a specified gas condition during the conveyance of the one or more substrates. The transverse substrate handler further includes one or more rails for supporting the one or more mobile transverse chambers, wherein the rail is positioned adjacent to entry of the process modules. One or more drive systems are provided for carrying and moving the one or more mobile transverse chambers on the rail.

A method for transferring substrates to two or more process modules is also provided and comprises conveying one or more mobile transverse chambers carried on a rail and positioned adjacent to the two or more process modules, and where each mobile transverse chamber is configured to independently maintain a specified gas condition during movement and conveyance of the substrates. The method also includes loading substrates into at least one of the one or more mobile transverse chambers, and actuating one or more drive systems to propel at least one of the one or more mobile transverse chambers along the rail. In addition, the method includes conveying at least one of the substrates from the mobile transverse chambers to at least one of the two or more process modules while maintaining the specified gas condition.

In another aspect, a method of transferring a substrate between two or more process modules or load lock station is provided, comprising: loading at least one substrate into one or more mobile transverse chambers, the mobile transverse chambers being carried on a rail positioned adjacent to the two or more process modules, and wherein each mobile transverse chamber is configured to maintain a specified gas condition during conveyance of the substrate; actuating one or more drive systems to propel the one or more mobile transverse chambers along the rail; docking the mobile transverse chamber to at least one of the process modules; and conveying the at least one substrate from the mobile transverse chamber to the at least one process modules.

In a further aspect, embodiments of the present invention provide for flexible transport of substrates while minimizing heat loss. For example, in one illustrative embodiment, a method of transferring one or more substrates between process modules or load lock stations is provided; comprising the step of: identifying a destination location D1 for a substrate S1 present at an initial processing location P1. If the destination location D1 is occupied with a substrate S2, the substrate S1 is maintained at the initial processing location P1. If the destination location D1 is available, the substrate S1 is transferred to the destination location D1. Additionally, if the destination D1 is occupied with the substrate S2 the method further comprises the step of identifying a destination location D2 for the substrate S2. In some embodiments, the method further comprises deciding which of the substrates S1 or S2 to transfer first to its respective destination location D1 or D2, based upon which of the substrates S1 or S2 has the longest processing time.

In yet a further aspect, a process module facility is provided comprising: at least one process chamber carried in frame, a subfloor adjacent the process module, at least one of a stationary pump and electrical box positioned atop the subfloor and gas control lines and vacuum exhaust lines housed within the subfloor and coupled the process chamber.

BRIEF DESCRIPTION OF THE DRAWINGS

The foregoing and other aspects of the present invention will be apparent upon consideration of the following detailed description, taken in conjunction with the accompanying drawings, in which like reference characters refer to like parts throughout, and in which.

DETAILED DESCRIPTION

Brief Overview

In general, the embodiments disclosed herein relate to systems and methods for processing of substrates, such as but not limited to glass and other substrates used in the solar or photovoltaic industry, and wafers used in the semiconductor industry. More particularly, some embodiments disclosed herein relate to systems and methods for substrate processing comprising one or more mobile transverse chambers for transporting substrates between process modules and other stations such as a load lock.

In some embodiments a system for processing substrates is provided, comprising: one or more mobile transverse chambers configured to move between two or more process modules and to convey one or more substrates to at least one of two or more process modules. Each mobile transverse chamber is configured to independently maintain a specified gas condition during movement between process modules and during conveyance of the one or more substrates to the process modules.

Methods for transferring substrates to two or more process modules is also provided and comprises conveying one or more mobile transverse chambers carried on a rail and positioned adjacent to the two or more process modules, and where each mobile transverse chamber is configured to independently maintain a specified gas condition during movement and conveyance of the substrates. The method also includes loading substrates into at least one of the one or more mobile transverse chambers, and actuating one or more drive systems to propel at least one of the one or more mobile transverse chambers along the rail. In addition, the method includes conveying at least one of the substrates from the at least one of the one or more mobile transverse chambers to at least one of the two or more process modules while maintaining the specified gas condition.

Figure 1A:
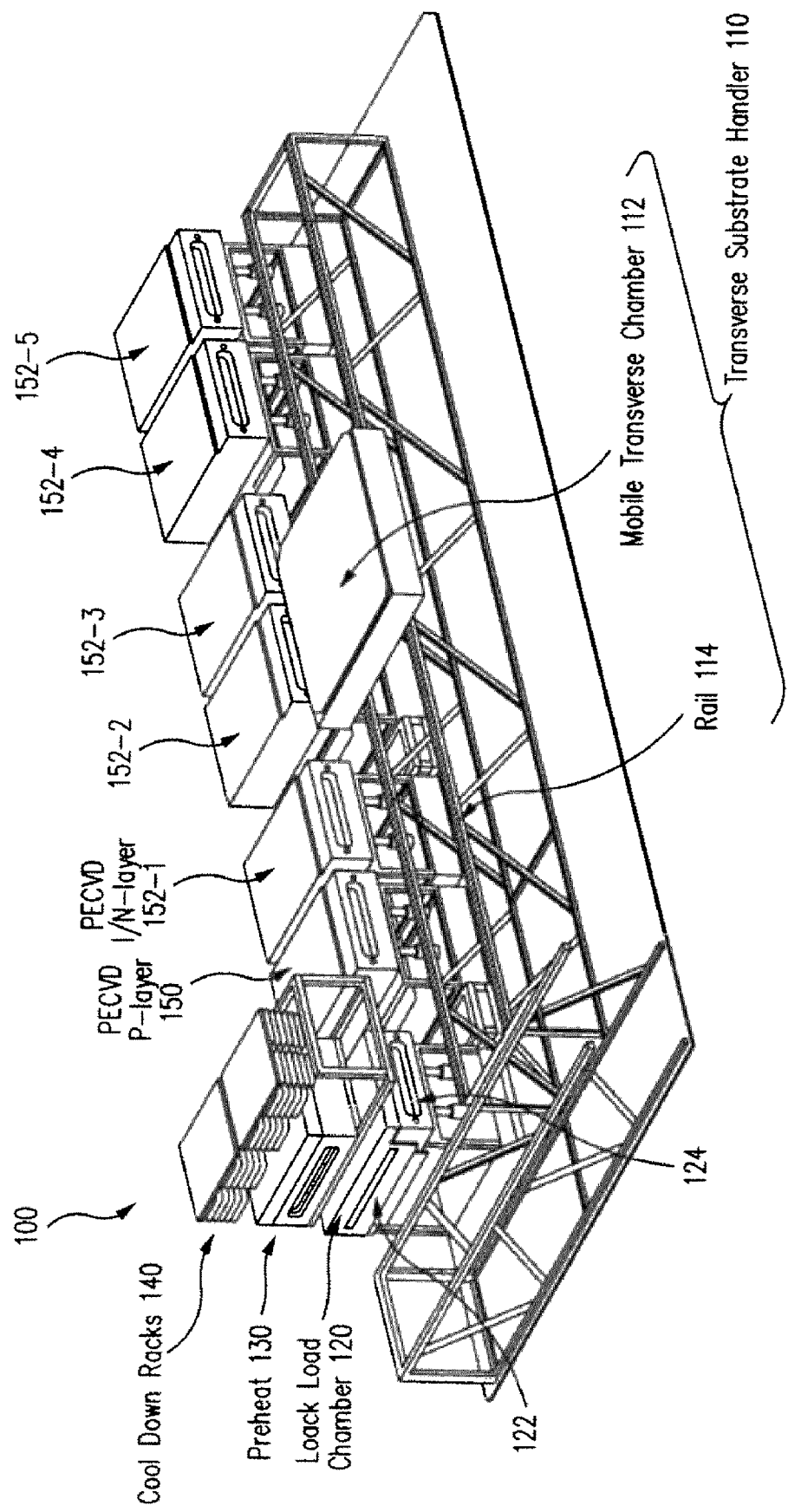
FIGS. 1A, 1B, and 1C illustrate one embodiment of a system of the present invention showing perspective, top, and front views, respectively.
Figure 1B:
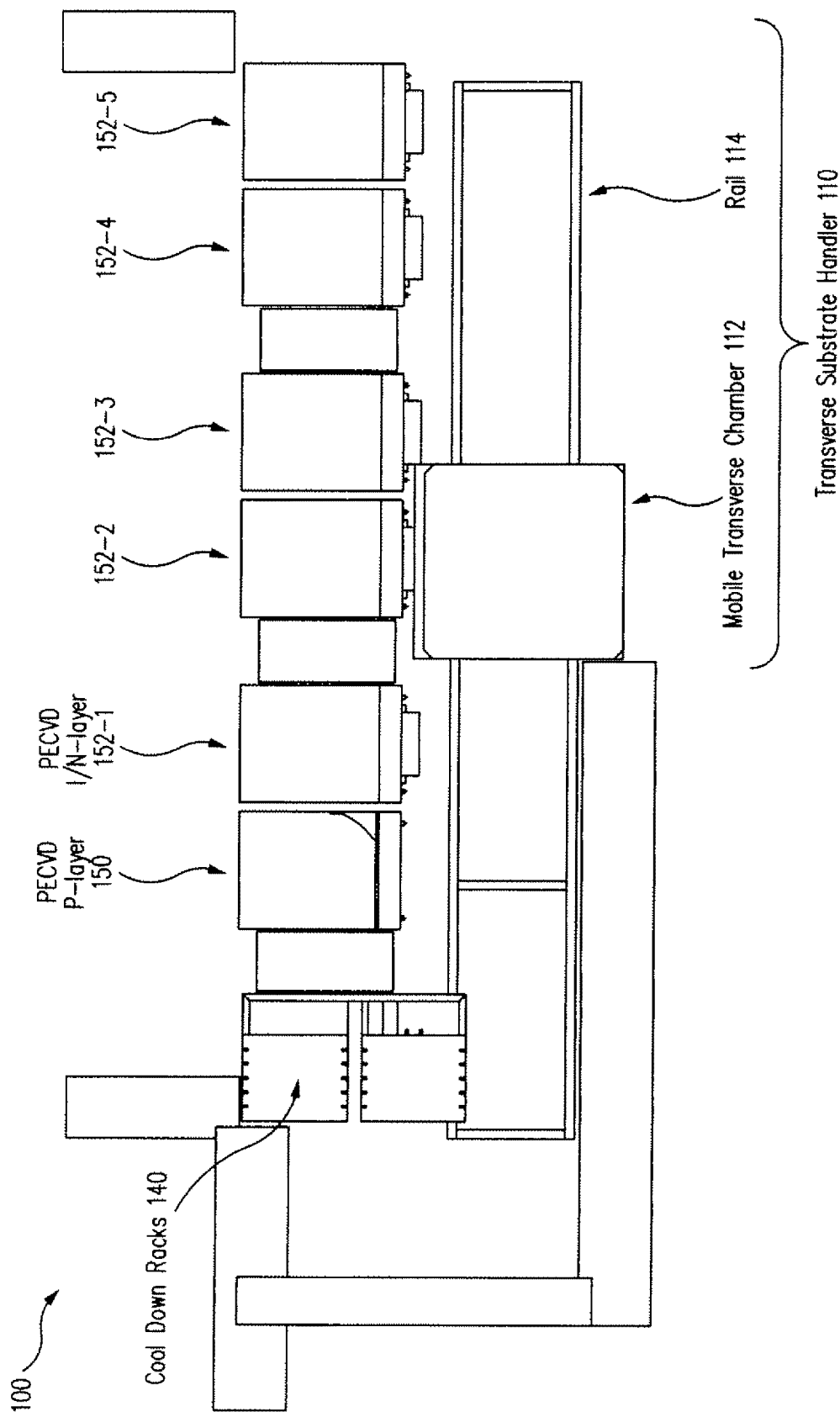
Figure 1C:
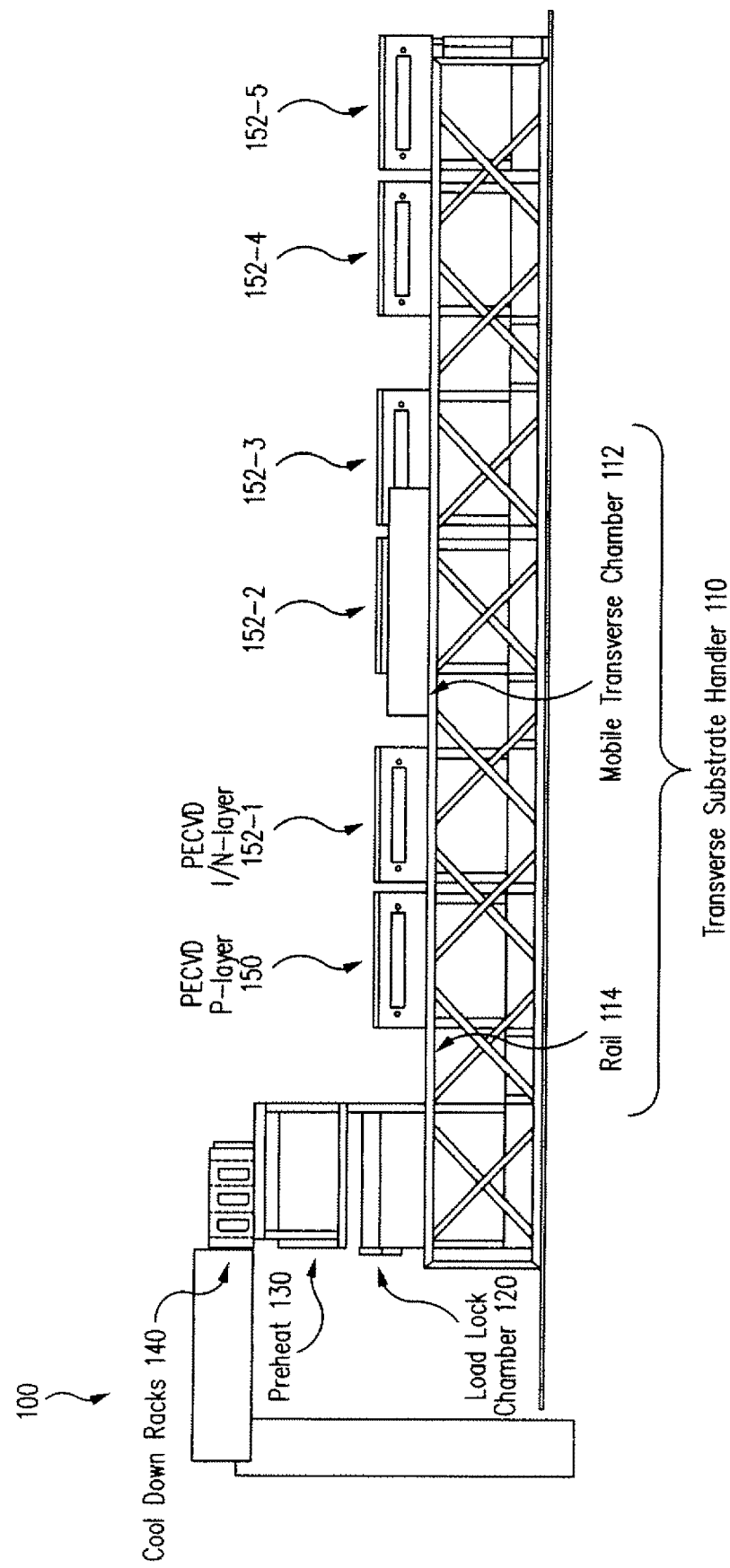

Referring to FIGS. 1A, 1B, and 1C, there is shown one embodiment of a system of the present invention. The system 100 generally includes transverse substrate handler 110, load lock chamber 120, and two or more process modules 150, 152. Each process module 150, 152 comprises a process chamber for processing the substrates.

Any number of substrates and wafers may be processed using the system 100 and method of the present invention. For example, photovoltaic substrates, such as silicon, glass, or metal plates, and the like may be processed to form solar cells. Of particular advantage the flexibility of the system of the present invention enables use of multiple process recipes to form various devices and applications.

In some embodiments, PECVD modules may be respectively configured for depositing different layers of both doped and updoped layers used to create a photovoltaic device, for example P-doped, i.e. boron doped silicon layers, and I, i.e. intrinsic silicon layers and N-doped, i.e. phosphorous doped silicon layers. In some embodiments, each process module is configured to deposit one type of layer only, such as one type among the P, I, or N layers.

In one exemplary embodiment, a single junction photovoltaic or solar cell is fabricated using the system 100 of the present invention. More specifically, a glass substrate with a transparent conductive oxide (TCO) film, such as but not limited to ZnO, may be deposited. After laser scribing to divide the TCO layers, subsequent layers of p-doped silicon, intrinsic silicon and n-doped silicon layers are deposited in the system of the present invention. The resulting film is further separated into cells followed by a TCO back contact layer formed by deposition.

Of significant advantage the overall flexible system architecture of the present invention enables one to selectively configure the system layout as desired. To form a solar or photovoltaic cell, the system 100 of the present invention utilizes a greater number of process modules for deposition of I-layer silicon or N-layer silicon than the number of process modules for deposition of P-layer silicon. As shown in FIG. 1A, multiple I/N layer modules 152-1, 152-2, . . . 152-5 are employed in-line in the system. Because the deposition of N-layers and I-layers may take more time than the deposition of P-layers, providing more process modules in the system 100 for deposition of I-layer silicon or N-layer silicon than the number of process modules for deposition of P-layer silicon can expedite the substrate processing.

In another exemplary embodiment, a tandem or multiple junction solar cell is fabricated using the system 100 of the present invention by repeating P-I-N layer deposition in the same system. In another embodiment, multi-junction solar cells are fabricated by deposition processes carried out on multi-line system configurations of the present invention.

System Architecture Embodiments

Referring to FIGS. 1A, 1B, and 1C, there is shown one embodiment of a system of the present invention illustrated in perspective, top and side views, respectively. The system 100 generally includes transverse substrate handler 110, load lock chamber 120, and two or more process modules 150, 152. Each process module 150, 152 comprises a process chamber for processing the substrates.

Substrates or wafers 115 are received from a main processing line or conveyors in a photovoltaic or semiconductor fab or foundry. A substrate handling robot (not shown) as well known in the art is generally configured to pick up substrates from the main processing line and to convey the substrates to particular stations for specific processing. In the exemplary embodiment the substrate handling robot is configured to transport the substrate to the load lock chamber 120. Typically the substrate handling robot includes an end effector (not shown) as is well known in the art. In some embodiments, the robot can transport multiple substrates simultaneously. For example, a dual-blade type robot system may be used to transport a substrate from the main processing line after picking up a processed substrate from the load lock chamber 120. The substrate handling robot may be configured to move horizontally to transport substrates to and from the load lock chamber 120 and then back to the main processing line. Alternatively, or optionally additionally, the substrate handling robot may be configured to move vertically to transport substrates between modules that are stacked or are positioned at different heights. For example, as shown in FIGS. 1A and 1C the system 100 optionally includes pre-heater 130 and cool down rack 140, which are located near the load lock chamber 120. The substrate handling robot may move vertically to transport substrates between the processing line and the pre-heater 130 and/or the cool down rack 140 and/or the load lock chamber 120 depending upon the desired sequence of processing. In another embodiment, a rotating robot is positioned adjacent the conveyor, and between the preheater 130 and cool down rack 140 on one side of the robot and the load lock chamber 120 another side of the robot, such that the robot services both the load lock 120 and the preheater/cool down rack.

Load lock chamber 120 may include two entrance slits 122, 124. The first entrance slit 122 is configured to receive a substrate from the substrate handling robot, and to permit removal of the processed substrate from system 100 and back to the main processing line. The second entrance slit 124 is configured to convey a substrate to and from the transverse substrate handler 110. Typically, the load lock chamber 120 is configured to maintain a desired gas condition and creates an isolated environment for the substrate or wafer. In some examples, the desired gas condition is a reduced pressure, or vacuum environment.

The transverse substrate handler 110 is generally configured to receive the substrates from load lock chamber 120 and to transfer the substrates to at least one of the two or more process modules 150, 152. The transverse substrate handler 110 generally comprises one or more mobile transverse chambers 112, rail 114, and one or more drive systems 116.

Each mobile transverse chamber 112 is configured to convey one or more substrates to at least one of the two or more process modules 150, 152. The mobile transverse chamber 112 is carried by rail 114, and is propelled along rail 114 by one or more drive systems 116. In some embodiments, the mobile transverse chamber 112 is configured to convey a single substrate. In some other embodiments, the mobile transverse chamber 112 is configured to convey two substrates, where the first substrate is conveyed for processing in one of the processing modules 150, 152, and the second substrate is processed by one of the processing modules 150, 152. In yet other embodiments, the mobile transverse chamber 112 is configured to convey the substrates in pairs.

Of particular advantage, the transverse substrate handler 110 comprises two or more mobile transverse chambers where each mobile transverse chamber 112 is configured to independently maintain a desired gas condition as the mobile transverse chamber moves between process modules. In other words, each mobile transverse chamber is configured to maintain a gas condition specified by the user during the conveyance of the substrates, and the gas condition may differ for each mobile transverse chamber. This enables significant flexibility in processing of the substrates. For example, to accommodate more than one mobile transverse chamber, a handoff station (not shown) is provided configured to receive substrates from one mobile transverse chamber and to convey to another mobile transverse chamber while maintaining the desired gas condition.

In some embodiments, the transverse substrate handler 110 may include two mobile transverse chambers 112. Each mobile transverse chamber is configured to independently maintain a specified gas condition during conveyance of the substrates. In some embodiments, the gas condition is the pressure inside the mobile transverse chamber. In other embodiments the gas condition is the type of gas environment in the mobile transverse chamber, and for example may include air; inert gas such as Helium (He), Neon (Ne), Argon (Ar), Krypton (Kr), and Xenon (Xe). Since the mobile transverse chamber contains an isolated environment it is even possible to configure the chamber to maintain a desired chemical environment, for example to select reactive gas(es) as the gas condition, such as silane ($SiH_4$), oxygen ($O_2$), dichlorosilane ($SiCl_2H_2$), nitrous oxide ($N_2O$), tetraethylorthosilicate (TEOS; $Si(OC_2H_5)_4$), phosphine ($PH_3$), arsine ($AsH_3$), diborane ($B_2H_6$), and the like, and mixtures thereof. The pressure of gas can range from vacuum to atmospheric pressure.

In another aspect of the present invention, the mobile transverse chamber 112 is configured to additionally maintain a desired thermal environment as well as the desired gas condition. In this example, the mobile transverse chamber may be heated. In this embodiment the mobile transverse chamber further includes a heat source. For example, without limitation, the mobile transverse chamber may be configured to promote oxidation or growth of a native oxide by heating the interior of the mobile transverse chamber while maintaining an oxygen rich environment inside the chamber.

In one illustrative embodiment, gas is maintained in the mobile transverse chamber at a pressure in the range of about 500 to 1000 mTorr, more usually in the range of 50 to 100 mTorr. In some embodiments the mobile transverse chamber maintains a gas condition such that the difference between the pressure in the mobile transverse chamber and the process module ($\Delta P$) is in the range of about 10 to 50 mTorr.

Rail 114 supports the one or more mobile transverse chambers 112. The rail 114 is positioned adjacent to entry of the process modules 150, 152. In some embodiments, the rail 114 supports the weight of the mobile transverse chambers 112. In some embodiments, the rail 114 supports the movement of the mobile transverse chambers 112. For example, the rail may be a support rail, which contacts the mobile transverse chambers through one or more mechanical bearings, to support the weight of the mobile transverse chambers 112. In another example, the rail 114 may be a drive rail, which is used to propel the mobile transverse chambers 112. In yet another example, the rail 114 may further include a guide which guides the movement of the mobile transverse chambers 112 to prevent rotating or tilting of the transverse module. Leveling mechanisms may also be carried on the rail. A single rail 114 may provide multiple functions described above. In some embodiments, the system 100 includes two or more rails 114. In some embodiments, the system 100 includes one mobile transverse chamber 112 on each rail 114. In some embodiments, the system 100 includes two or more mobile transverse chambers 112 on each rail. A single rail may contain two parallel supports to spread the load of the transfer module and to provide anti-rotation of the module along the rail axes.

A respective drive system 116 propels the mobile transverse chamber 112. In some embodiments, the drive systems 116 require additional components, such as a drive rail discussed above, to move the mobile transverse chambers 112. For example, the drive system 116 may include a linear motor, a rack and pinion system, or a pulley and belt system. In some embodiments, each mobile transverse chamber 112 has a respective drive system 116. In some embodiments, the drive systems 116 are attached to the rail 114. Alternatively, the drive system 116 may be independent of the rail. A cable track system may be used to provide pneumatic supply and electrical power to the transverse substrate handler.

Process modules 150, 152 may be comprised of any suitable process module used in the processing of semiconductor and PV devices. For example, suitable process modules include without limitation: chemical vapor deposition chambers (CVD), plasma enhanced chemical vapor deposition (PECVD) chambers, atomic layer deposition (ALD) chambers, etching chambers; physical vapor deposition (PVD) chambers, annealing furnace, rapid thermal annealing (RTP) furnace, atmospheric pressure CVD chamber (APCVD), evaporative coating chamber, and the like.

Figure 2:
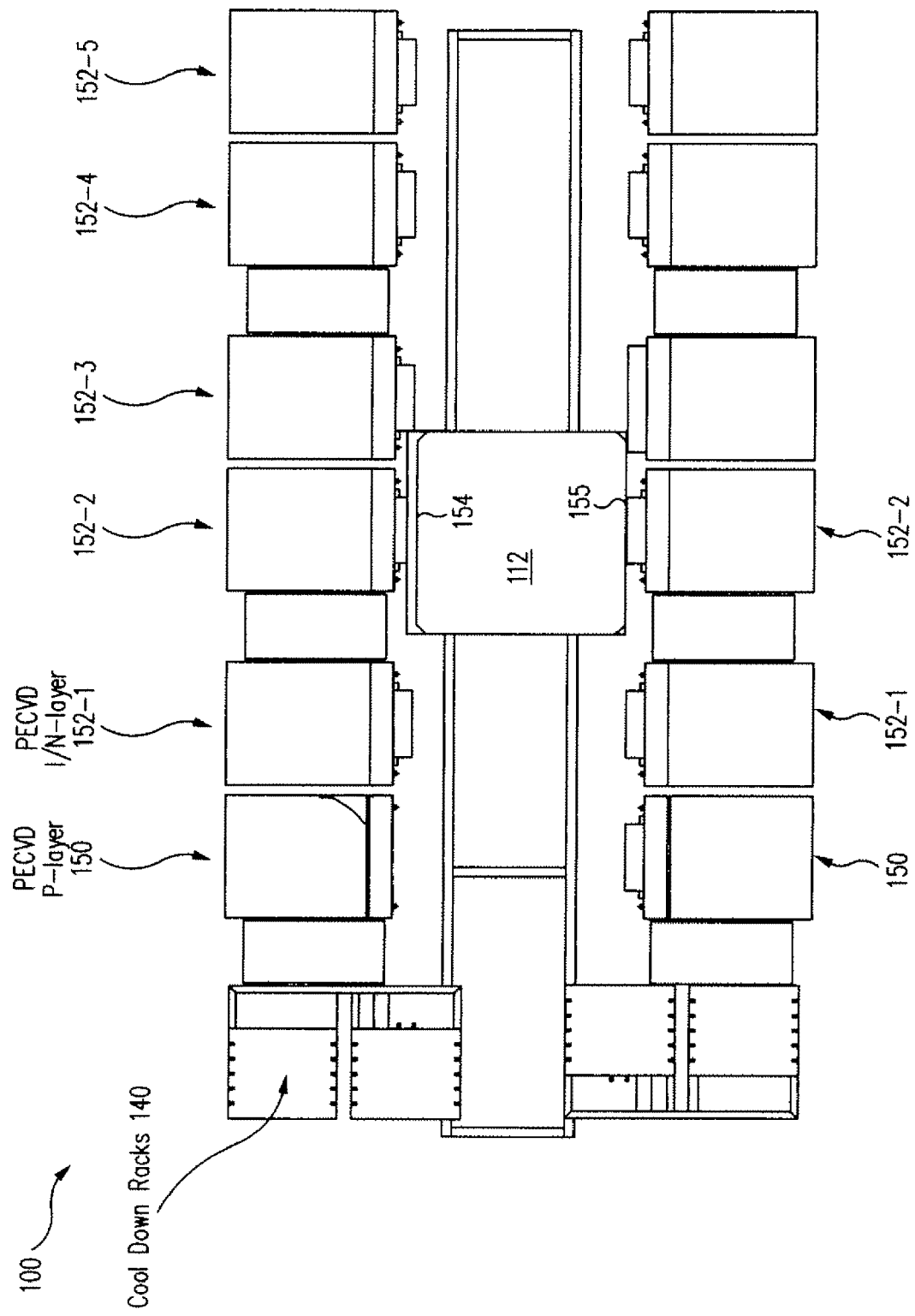
FIG. 2 is a top view of another embodiment of a system according to the present invention.

Many other embodiments of the present invention are possible. For example, referring to FIGS. 2 to 4, alternative embodiments are illustrated. More specifically, in FIG. 2 two parallel systems are shown where the mobile transverse chamber 112 services process modules 150, 152 positioned adjacent opposite sides of the mobile transverse chamber 112. In this embodiment one mobile transverse chamber 112 is carried on rail 114 and positioned between and a plurality of process modules. Here, transverse chamber 112 includes two openings or slits 154 and 155 on opposite sides of the transverse chamber 112.

Figure 3:
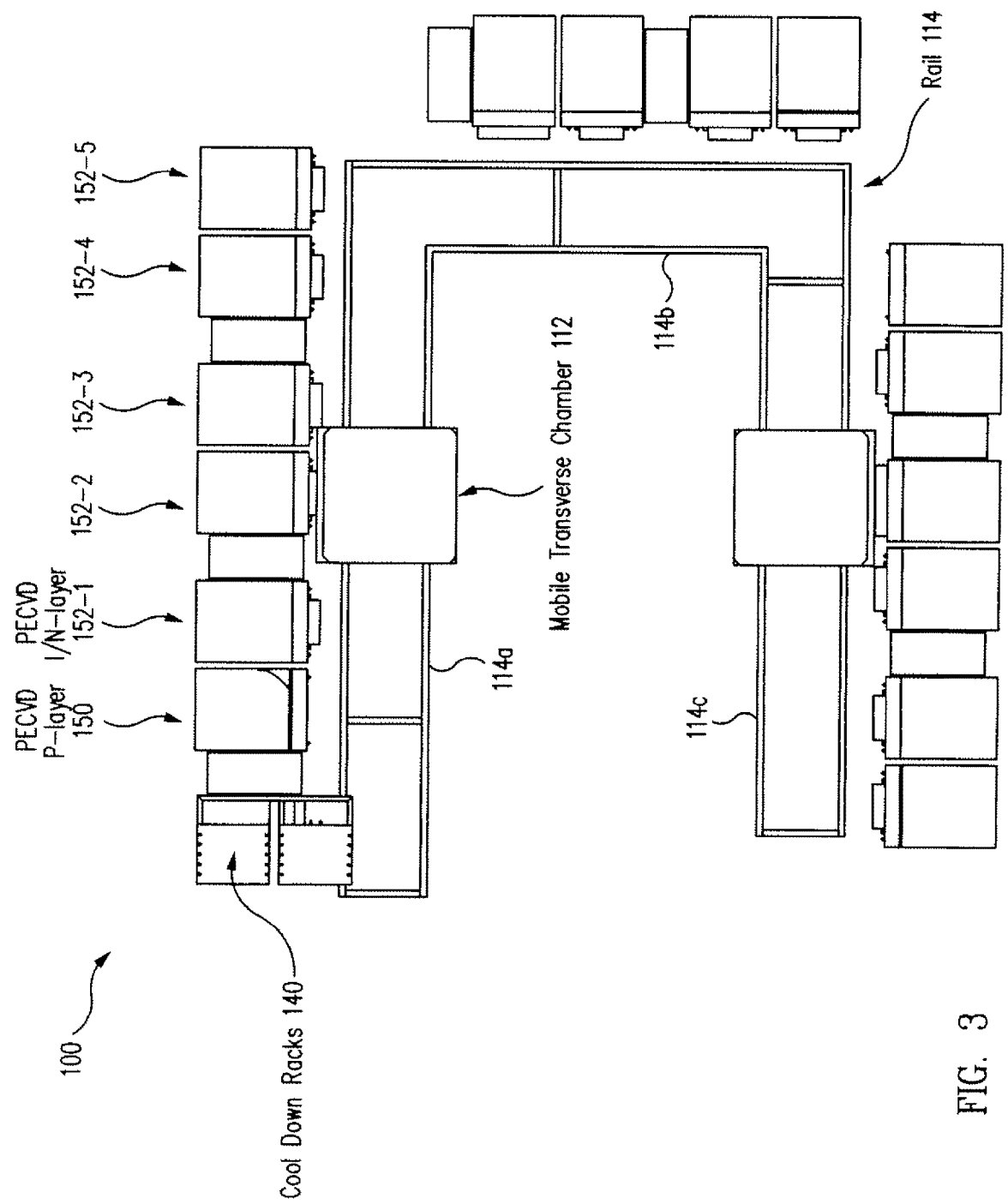
FIG. 3 shows a top view of an additional embodiment of a system according to the present invention.
Figure 4:
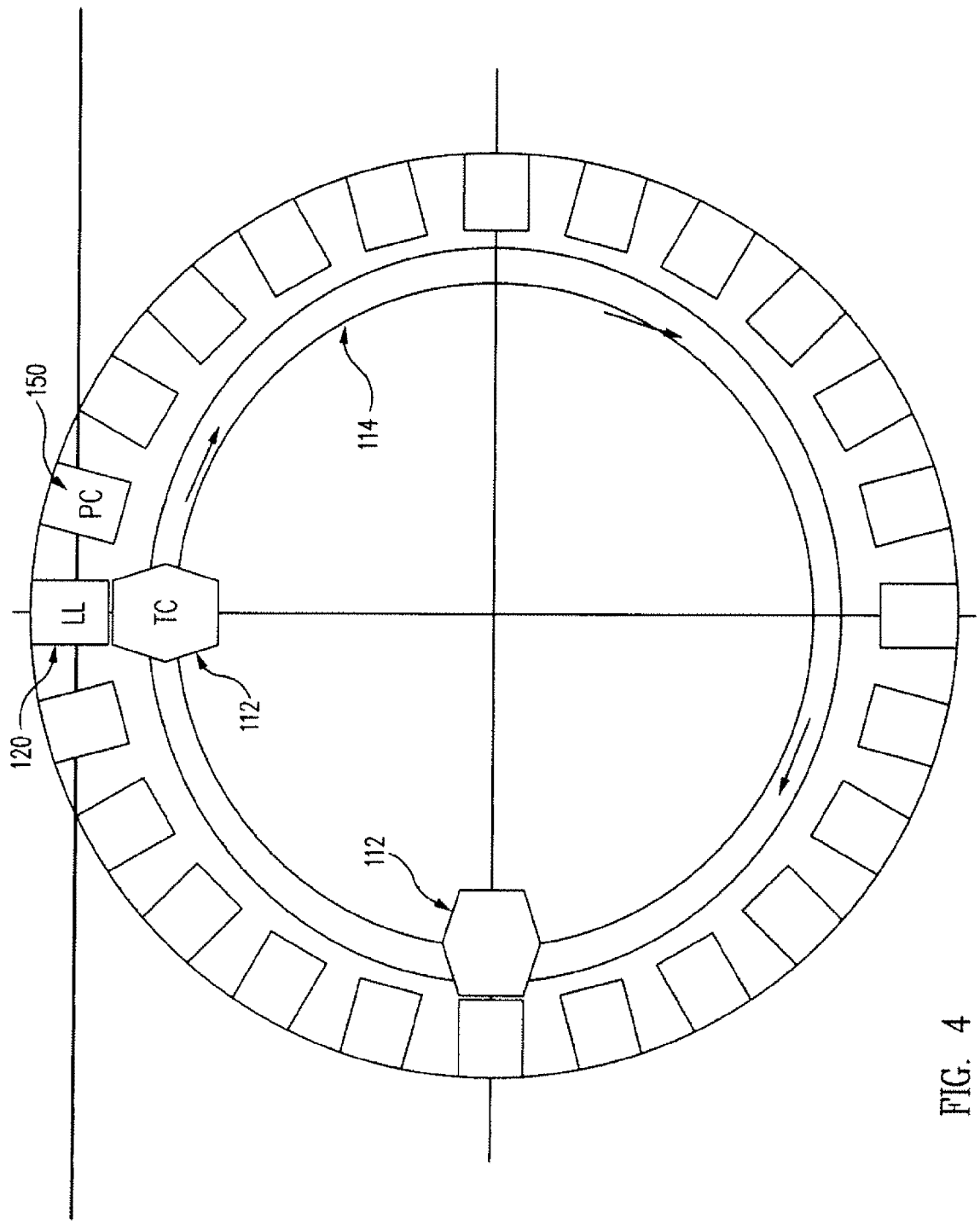
FIG. 4 shows a simplified top plan view of a linear circular arrangement according to even further embodiments of a system of the present invention.

Referring to FIG. 3, a U-shaped cluster type system is shown. In this embodiment the process modules and transverse substrate handler are positioned in a U-shaped arrangement with multiple sections of rail 114a, 114b and 114c. Alternatively, the system can be configured in a circular arrangement where the process modules and rail are arranged in a circle as shown in FIG. 4.

Figure 5:
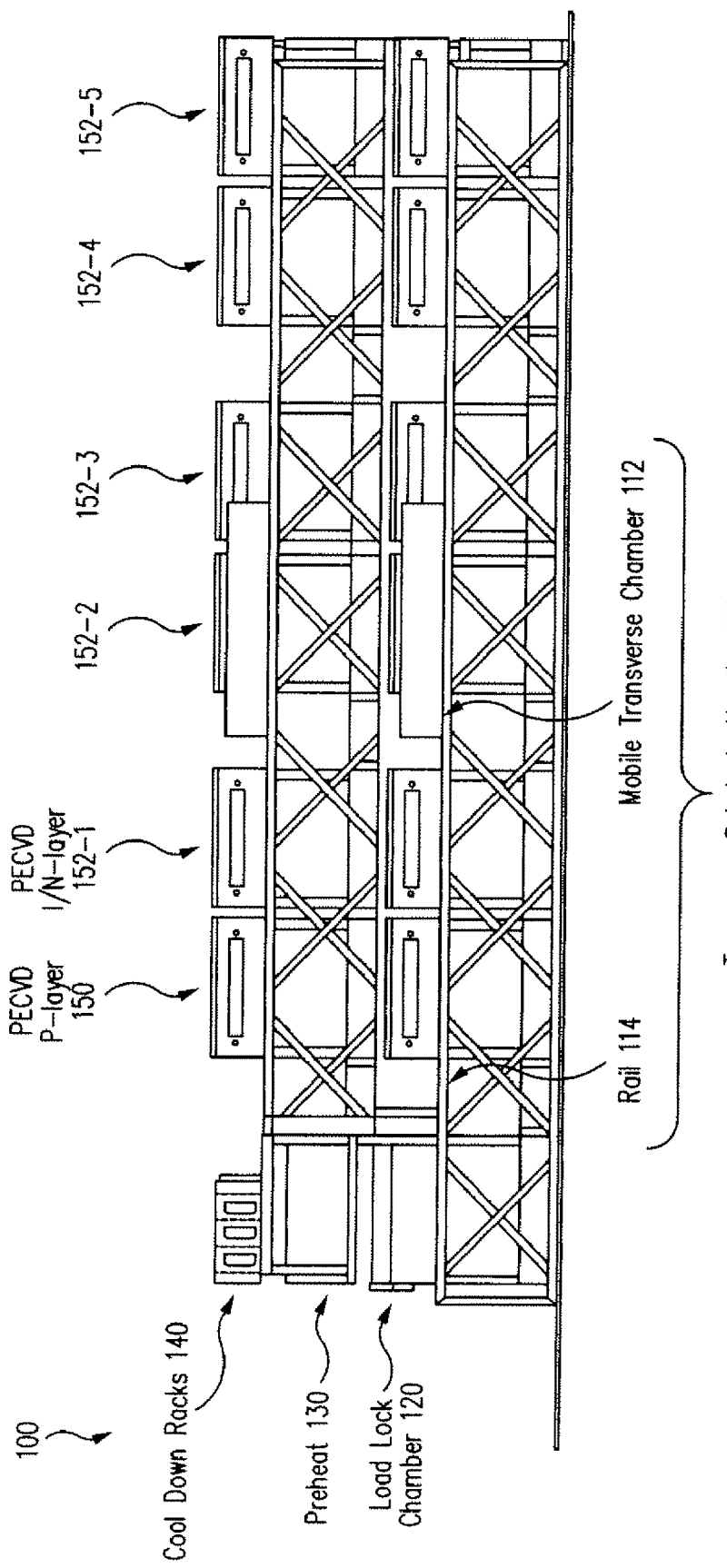
FIG. 5 depicts a front view of yet a further embodiment of a system according to the present invention.

To increase throughput, or to decrease processing time, some embodiments of the system of the present invention employ stacked process modules with associated stacked transverse substrate handlers as illustrated in FIG. 5.

Figure 6:
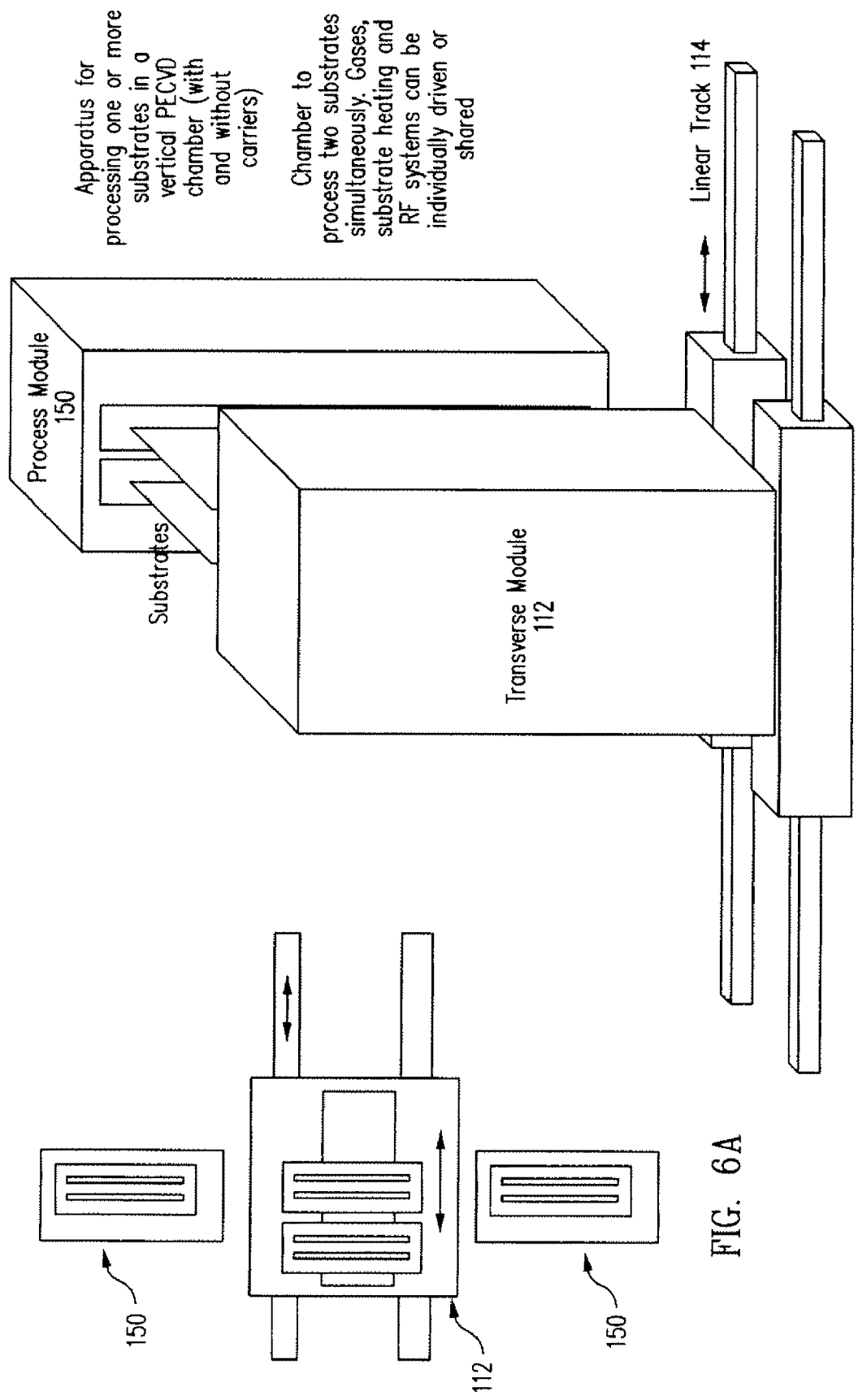
FIGS. 6A and 6B illustrate top and isometric views, respectively, of a vertical arrangement according to other embodiments of a system of the present invention.

In the exemplary embodiments shown above, the substrates are transported and processed in a horizontal manner. In an alternative embodiment substrates may be transported vertically, and typically but not necessarily in pairs, as shown in FIGS. 6A and 6B. In this instance, the process modules are configured to support the substrates vertically during processing, and the mobile transverse chamber is configured to transport the one or more substrates in a vertical position.

Thus, while certain specific embodiments are shown and described herein, those of skill in the art will recognize that various other system layouts and arrangement are possible and fall with the spirit and scope of the present invention. As shown, the flexibility of the inventive system enables multiple system configurations and layouts.

Transverse Substrate Handler and Mobile Transverse Chamber

Figure 7:
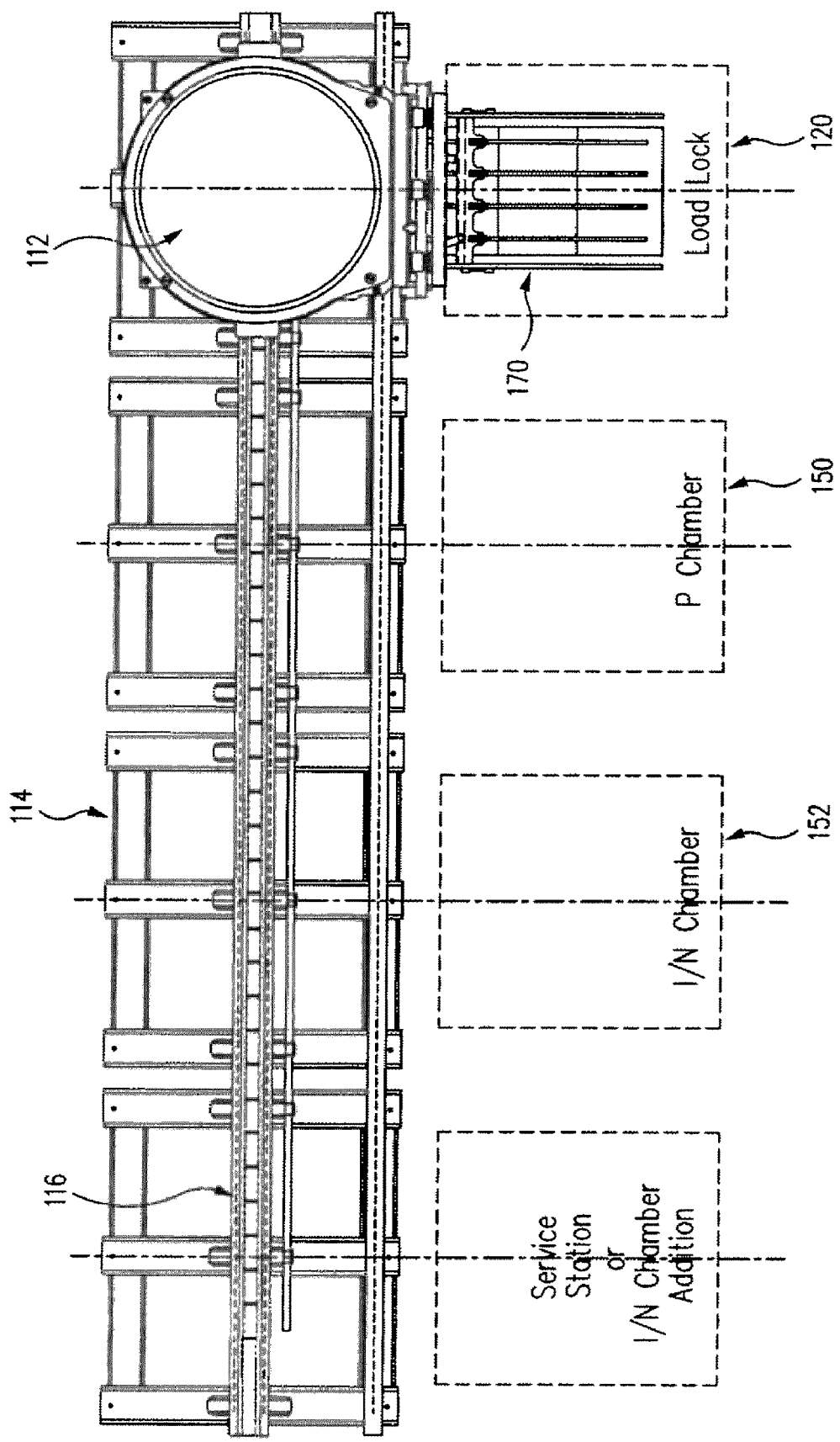
FIG. 7 illustrates an isolated top plan view of one embodiment of a system according to the present invention showing a mobile transverse chamber in a docked position at a load lock station.
Figure 8:
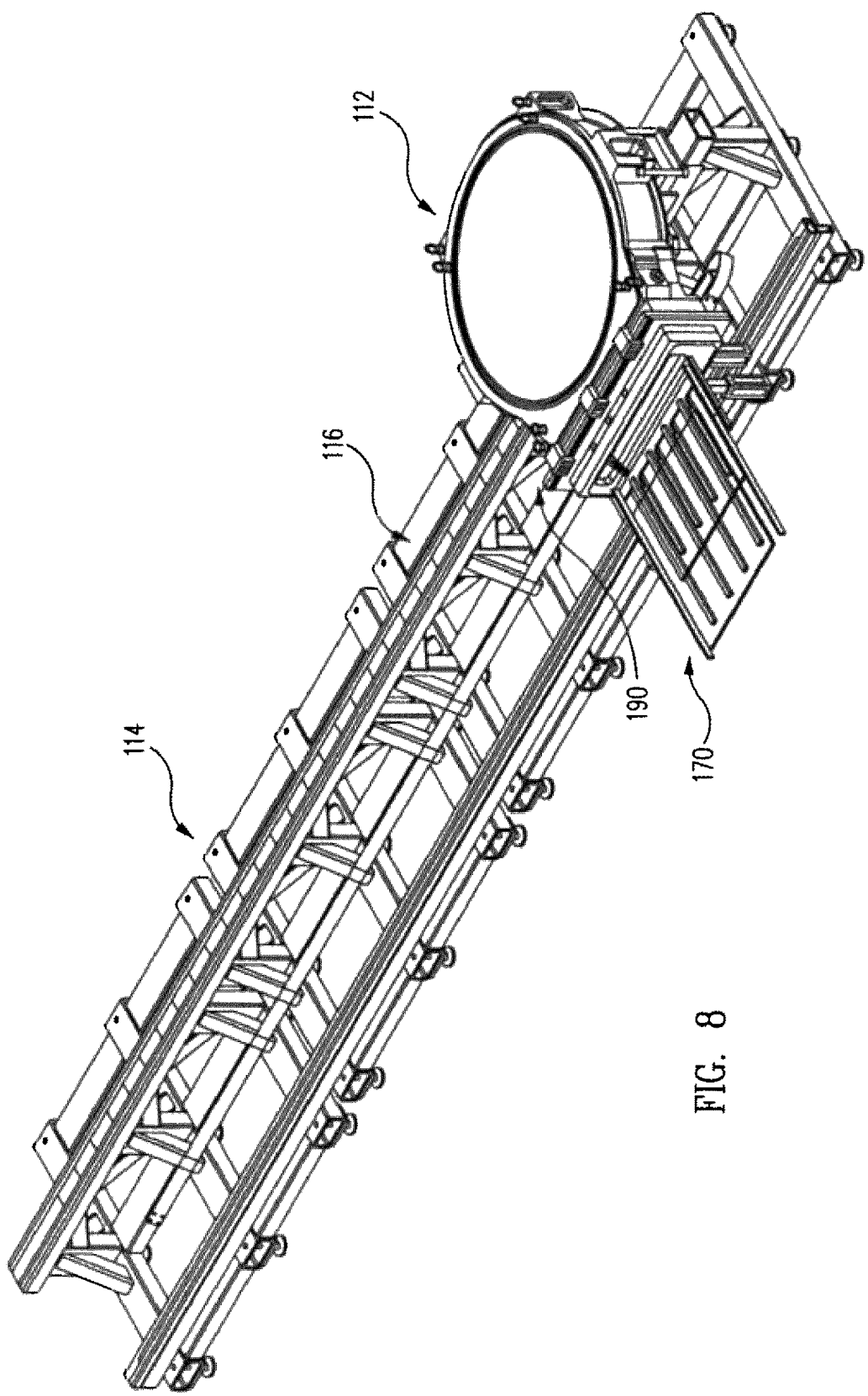
FIG. 8 shows a partial, isometric view of a mobile transverse chamber carried on a rail.

The system of the present invention provides significant flexibility with respect to processing of substrates, particularly in connection with large substrates that are otherwise cumbersome and difficult to process. Additionally, the flexibility of the present invention enables complicated process recipes to be carried out all in one integrated system. For example and without limitation, the present invention enables parallel processing of substrates which is particularly advantageous for substrates requiring both long processing time and short processing time. Of significant advantage, the mobile transverse chamber of the present invention is configured to move between two or more process modules and to convey one or more substrates to at least one of two or more process modules while maintaining a desired gas environment. Each mobile transverse chamber is configured to independently maintain a specified gas condition during movement between process modules and during conveyance of the one or more substrates to the process modules. Referring to FIGS. 7 and 8 isolated top plan and isometric views, respectively, are shown for one embodiment of a mobile transverse chamber 112. In FIG. 7 the mobile transverse chamber 112 is shown in a docking position at a load lock chamber or station 120. Mobile transverse chamber 112 is carried by rail 114, and in this example the drive system 116 is comprised of a linear motor assembly 160 which propels the mobile transverse chamber 112 is a linear fashion along the rail 114.

To transfer substrates to and from the mobile transverse chamber 112 and to and from a particular process module or other station, the mobile transverse chamber 112 further comprises a transfer robot assembly 170.

Figure 10:
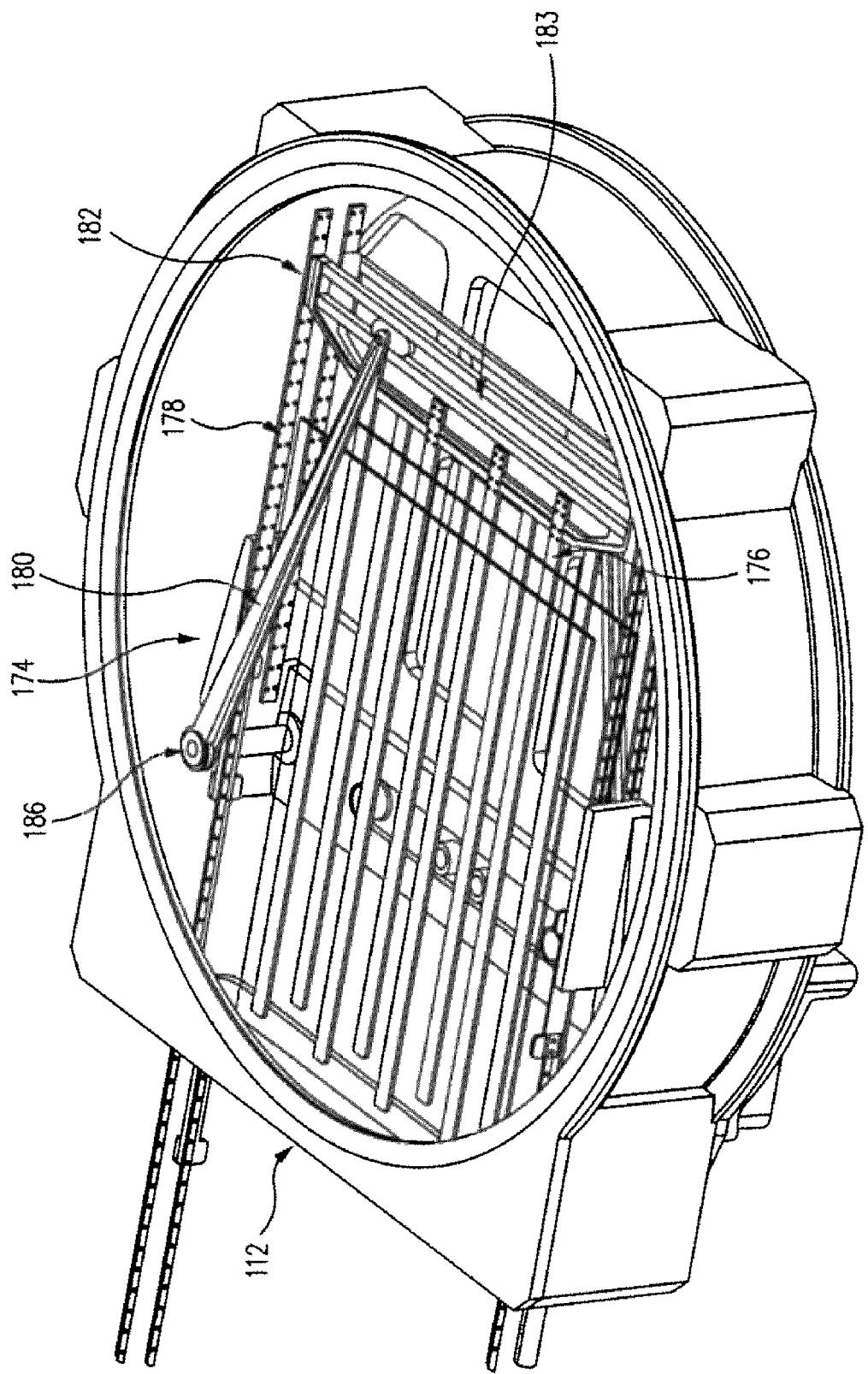
FIGS. 10 and 11 show perspective, partially cut-away views of a mobile transverse chamber in the retracted and extended positions, respectively, according to some embodiments of the present invention.
Figure 11:
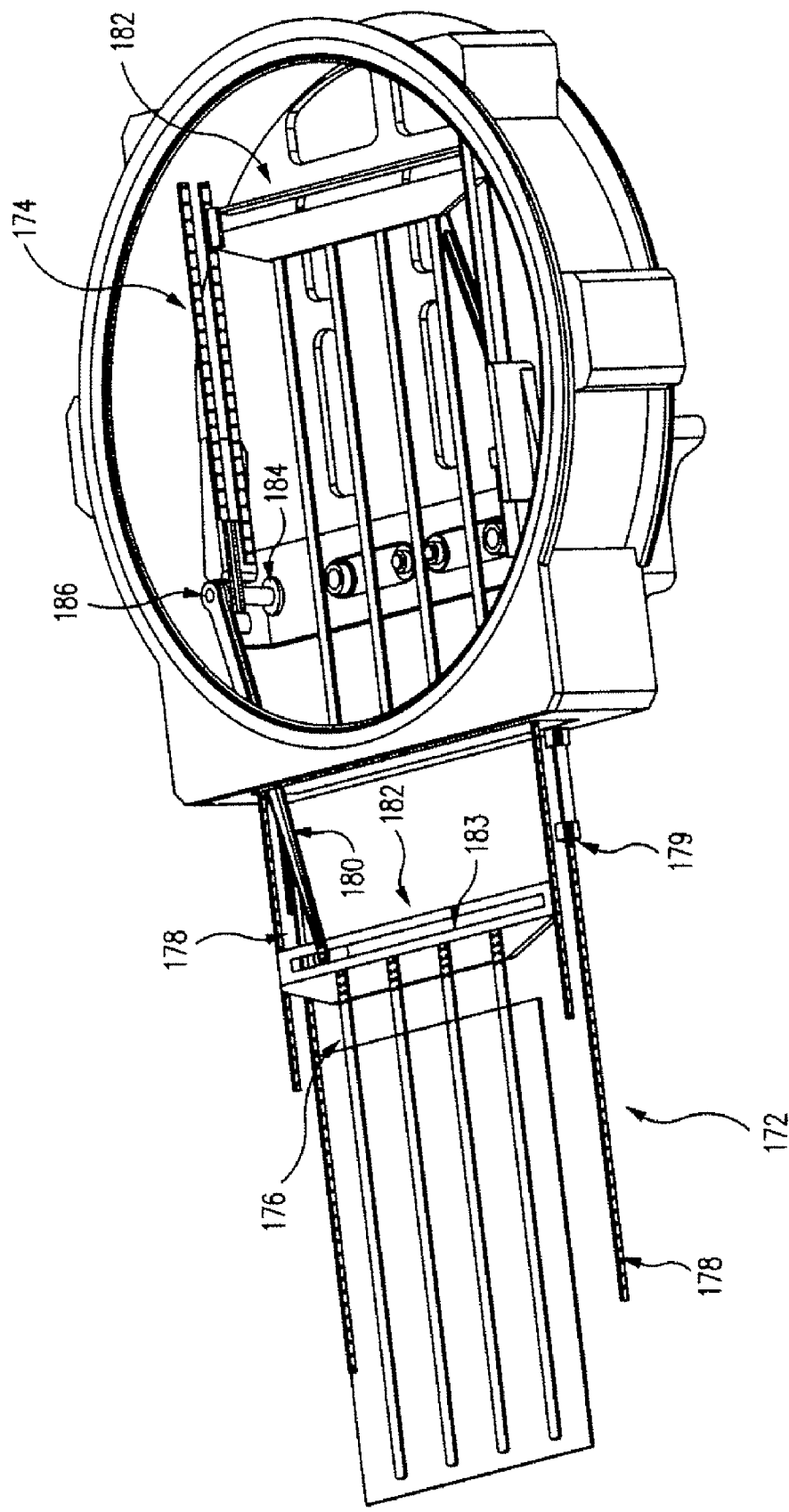

In general, transfer robot assembly 170 is configured to secure the substrate in the transverse chamber 112 during transport in a retracted position as depicted in FIG. 10, and to move the substrate to and from the process modules and other stations during processing in an extended position as depicted in FIG. 11.

In some embodiments, the transfer robot assembly 170 comprises a substrate holder 172 and a linear actuator. The substrate holder 172 may be configured to hold two or more substrates. For example, the substrate holder may have multiple slots to hold the two or more substrates. In another example, the substrate holder may be configured to hold two or more cartridges, where each cartridge is configured to hold one or more substrates. A linear actuator moves the substrate holder to allow a substrate or a cartridge to be loaded to an empty slot on the substrate holder, or to allow a substrate or a cartridge to be unloaded from a loaded slot on the substrate holder. The linear actuator may be comprised of any suitable actuator mechanism, such as for example without limitation: a rail and a linear motor; a rack and pinion system; or a pulley and belt system.

Figure 9:
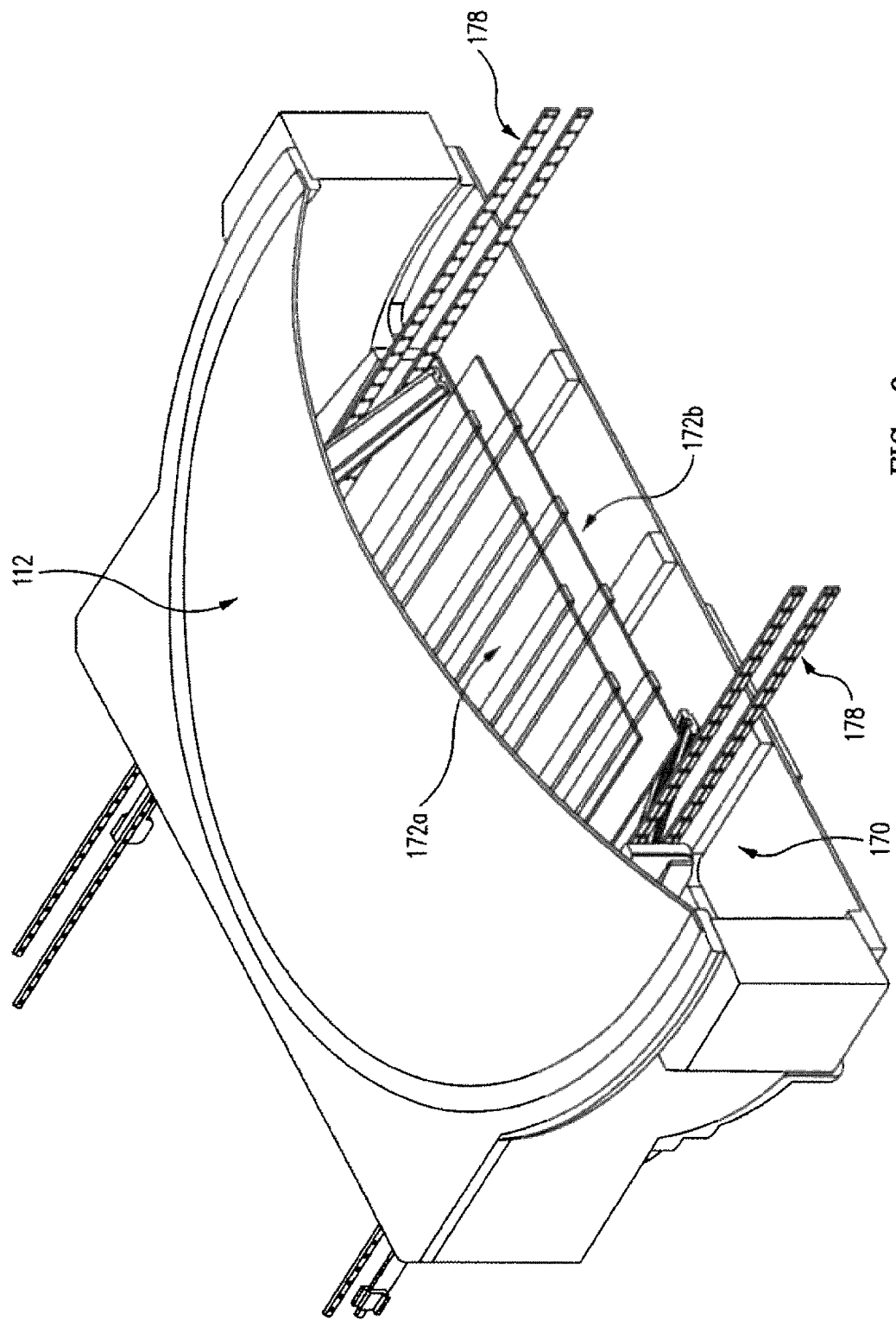
FIG. 9 illustrates a perspective, partially cut-away view of a mobile transverse chamber according to some embodiments of the present invention.

In an illustrative embodiment shown in FIGS. 9 to 11, the transfer robot assembly 170 is comprised of substrate holder 172 actuated by a swing arm mechanism 174. Substrate holder 172 can be formed of any suitable support. In one example substrate holder 172 is comprised of a solid flat plate. In another example, as shown in the figures, substrate holder 172 is comprised of multiple prongs 176 which support the substrate 115. In this embodiment, the substrate holder may further include rails 178 at the outer edges of the prongs 176. Rails 178 are configured to support the substrate at its edge and may also include a centering mechanism, such as stops or bumpers 179 to assist with centering and securing the substrate during transport.

Substrate holder 172 may be configured to support one or more substrates. In one embodiment, mobile transverse chamber 112 houses two substrates as shown in the cut-away view of FIG. 9. In this instance, a top substrate holder 172a and bottom substrate holder 172b are provided. Preferably, each substrate holder is independently configured to maximize flexibility of the system and to increase throughput.

Figure 12:
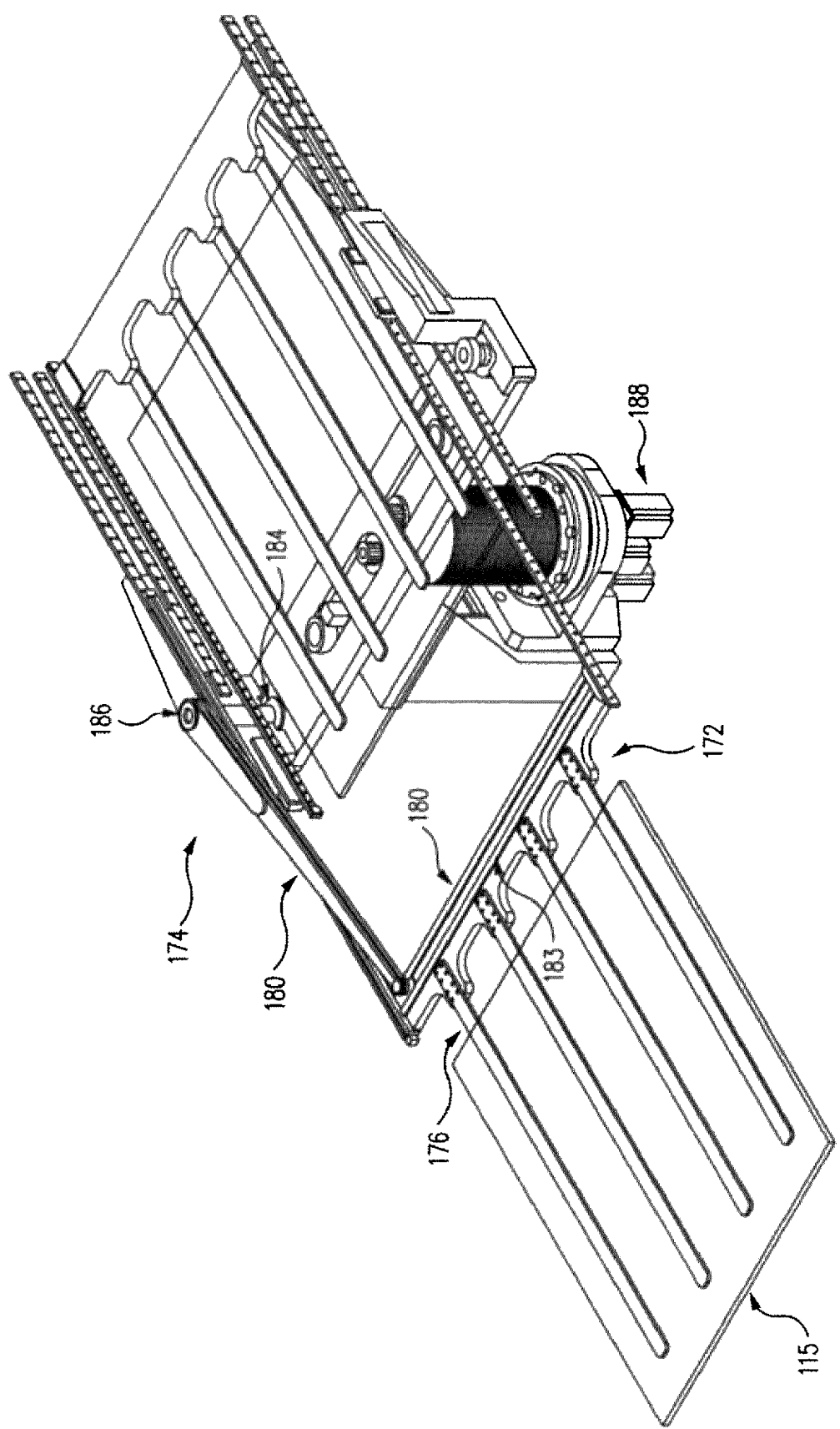
FIG. 12 is an isolated perspective view of the transfer robot assembly of the mobile transverse chamber according to some embodiments of the present invention.

Swing arm mechanism 174 is configured to actuate the substrate holder 172 and to move between a retracted and extended position as shown in FIGS. 10 and 11. As shown in FIG. 12 swing arm mechanism 174 is generally comprised of swing arm 180 and slide 182. One end of swing arm 180 moves within channel 183 of slide 182. The opposite end of swing arm 180 pivots about fixed post 184 via linkage and slider bearing 186 driven by swing arm drive shaft 188.

In some embodiments, the mobile transverse chamber 112 comprises two or more entrance slits. Referring again to FIG. 2, the first entrance slit 154 is located on one side of the mobile transverse chamber and the second entrance slit 155 is located on the opposite side of the mobile transverse chamber. In some embodiments, the entrance slits are used to convey substrates from one side of the mobile transverse chamber 112 to the other side of the mobile transverse chamber 112. For example, the process modules 150, 152 may be located in two lines, and a rail may be positioned between the two lines. The mobile transverse chamber 112 may load or unload substrates from the process modules positioned on one side of the rail through the first entrance slit, and from the process modules positioned on the other side of the rail through the second entrance slit.

Figure 13:
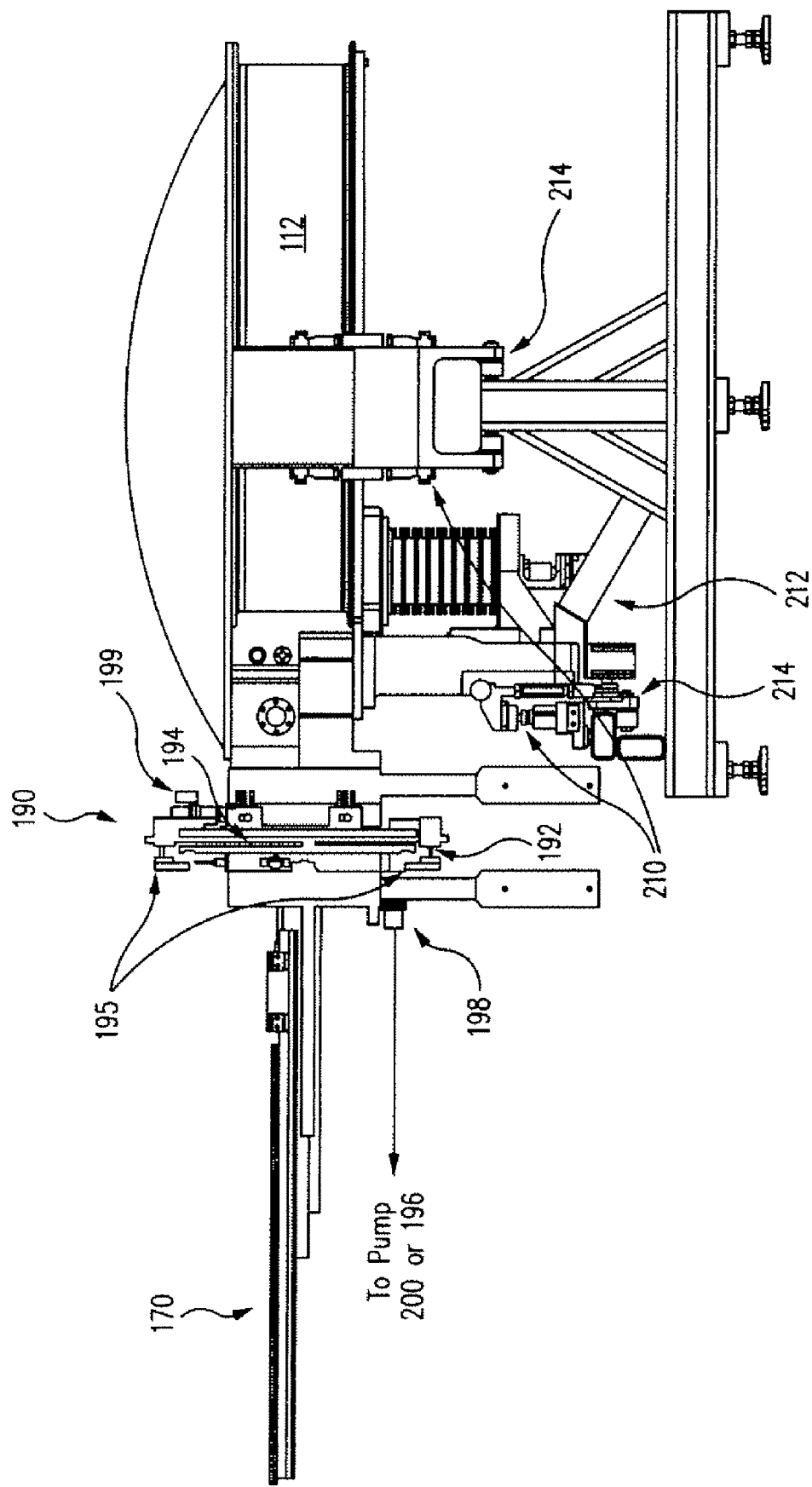
FIG. 13 is a side plan view of a mobile transverse chamber with docking assembly according to some embodiments of the present invention.

Of particular advantage the mobile transverse chamber 112 is configured to maintain a specified gas condition when transporting substrates within the system, and optionally when coupled to the process chambers and/or other stations. In some embodiments, the mobile transverse chamber 112 includes docking assembly 190 as illustrated in FIG. 8 and FIG. 13. In some embodiments, docking assembly 190 is carried on the mobile transverse chamber 112. In other embodiments, docking assembly 190 may be carried on the process module, as well as on the load lock chamber.

Docking assembly 190 is generally configured to facilitate transfer of the substrates from the mobile transverse chamber to a process module or other station while maintaining the integrity of the environment in the mobile transverse chamber 112. Docking assembly 190 may further be configured to minimize cross contamination of the mobile transverse chamber by establishing a positive air or gas flow in the direction of the process module or other station. Thus, gas or air does not flow into the mobile transverse chamber when docking at a process chamber or other station. In one illustrative embodiment, gas is maintained in the mobile transverse chamber at a pressure in the range of about 500 to 1000 mTorr, more usually in the range of 50 to 100 mTorr. In some embodiments the mobile transverse chamber maintains a gas condition such that the difference between the pressure in the mobile transverse chamber and the process module ($\Delta P$) is in the range of about 10 to 50 mTorr.

Figure 14:
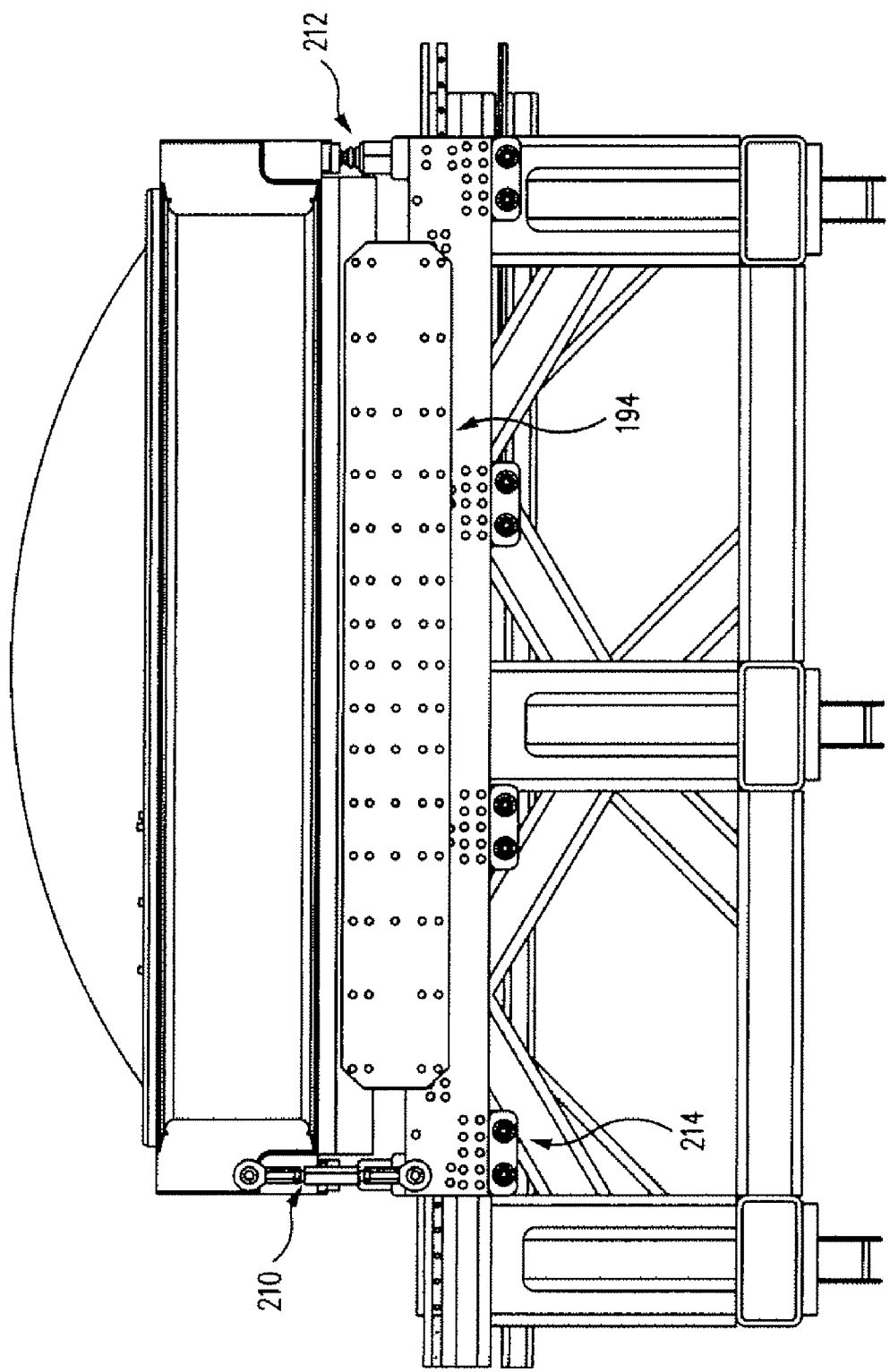
FIG. 14 depicts a partial, cut-away side view of a mobile transverse chamber carried on a rail according to some embodiments of the present invention.

Referring to FIGS. 13 and 14, docking assembly 190 is comprised of a vacuum flange 192 and expandable membrane or bellows 194 configured to maintain the gas condition when coupled to a process module or other station. Membrane 194 is typically deformable. The vacuum flange may comprise a flange, an O-ring, and a lip seal, and is arranged to mate with a flat seal surface on the process chamber or load lock by pneumatically actuated cylinder clamps 195.

Coupled to the expandable or deformable membrane 194 is a vacuum source attached to the stationary side of buffer media pumping port 198. A buffer media vent valve 199 may also be provided. In one example a stationary pump 200 is installed near the load lock and lines are connected to the buffer media pump ports 198 at each process chamber. When the mobile transverse chamber is docked at a process module, an air pocket or gap is formed between the expandable bellows 194 and the process module. Stationary pump 200 is coupled to buffer media pumping port 198 and is configured to pump down this air gap to vacuum prior to opening of the process chamber and transfer of the substrate from the mobile transverse chamber. This creates positive air flow in the direction of the process chamber and thus isolates the mobile transverse chamber 112 from any reactant gases or other contaminants present in the process chamber.

Alternatively, at least one process module includes a stationary pump 200 configured to evacuate air in the air gap between the mobile transverse chamber 112 and a process module 150, 152 or a load lock chamber 120 when the mobile transverse chamber 112 is coupled to a respective process module 150, 152 or a load lock chamber 120.

In yet a further embodiment, a mobile evacuation pump 196 carried on the mobile transverse chamber 112, and the stationary pump 200 carried on the process module or load lock are provided. In this embodiment, the mobile evacuation pump 196 may be employed to evacuate the air gap formed between the mobile transverse chamber and the process chamber when docked. Once the air gap is evacuated, the process chamber opens and then the stationary pump 200 evacuates both the process chamber and the mobile transverse chamber. This provides significant flexibility and advantage since the stationary pump 200 may be configured of large capacity sufficient to evacuate a relatively large cavity, whereas the evacuation pump 196 may be of smaller capacity for evacuating only the air gap and thus easily carried on a mobile platform. Alternatively, the stationary pump 200 is used to evacuate the air gap and to further evacuate the mobile transverse chamber and process chamber or load lock during transfer of the substrates.

In another embodiment, a large pump may be used in conjunction with a series of vacuum lines connected to each of the buffer media ports 198 and isolated by air operated valves at the port 198. In this embodiment, the vacuum lines may act as a vacuum reservoir enabling fast evacuation of the air gap.

To assist with docking, a number of leveling and/or guide mechanisms may be employed. For example, as shown in FIGS. 13 to 14, leveling mechanisms 210 are included on the frame assembly and/or mobile transverse chamber 112. Any suitable leveling mechanism may be used, such as for example without limitation: adjustment rods, compression tie rods, leveling hitch ball, and the like. A balance track 212 may also be incorporated into the frame for additional stability. Safety guide rollers 214 may further be incorporated into the rail 114 and/or carried on the bottom of the mobile transverse chamber 112. The cable carrier track 115 houses the electrical and air lines, and may be comprised of a flexible belt or track like linkage.

Methods of Substrate Handling and Docking

Figure 15:
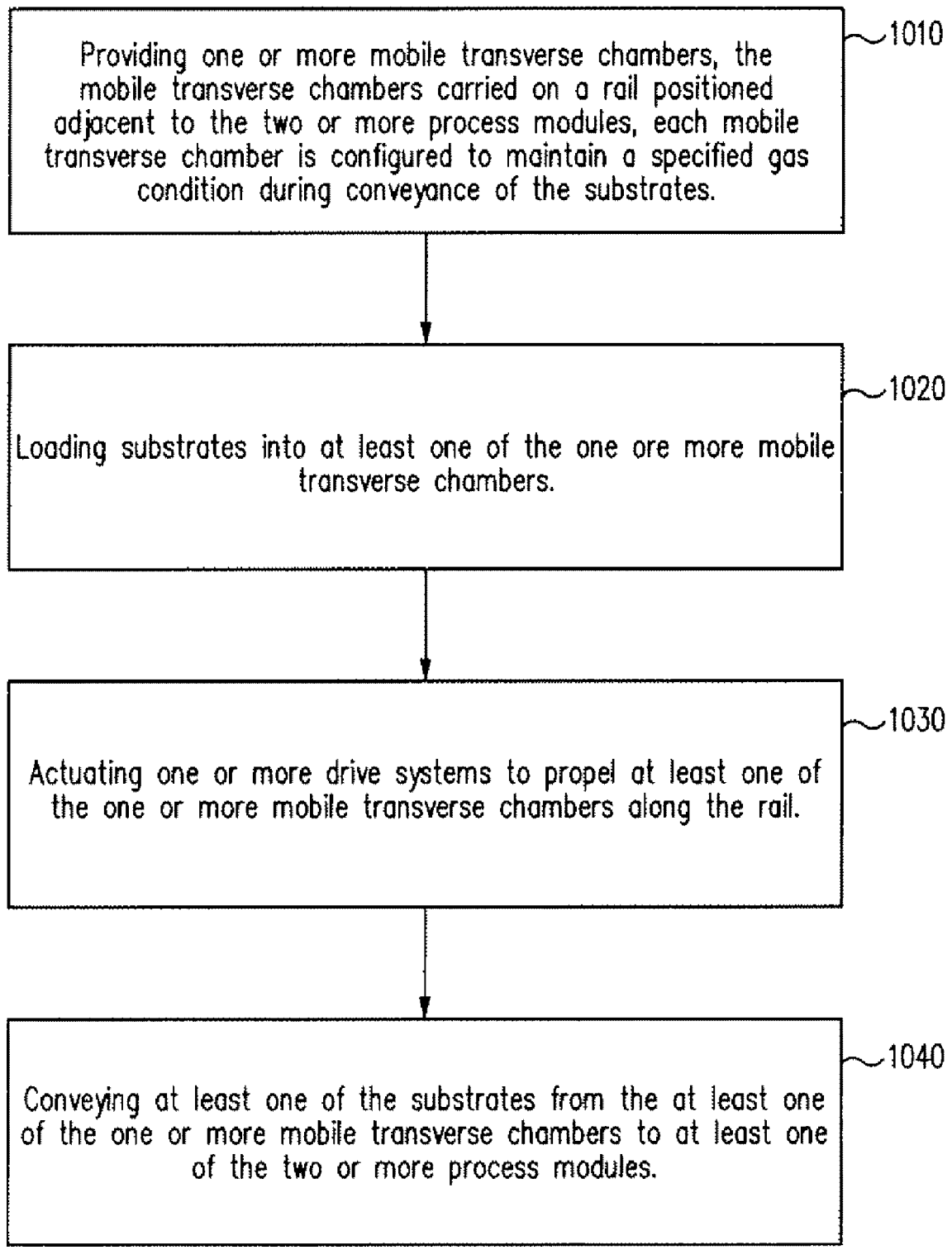
FIG. 15 is a flow chart illustrating steps in a method for transferring substrates to two or more process modules in accordance with some embodiments of the present invention.

Of particular advantage, the present invention promotes flexible substrate processing. FIG. 15 illustrates a method for transferring substrates to two or more process modules in accordance with some embodiments. At step 1010, one or more mobile transverse chambers are provided. The mobile transverse chambers are carried on a rail, and are movable along the rail. The rail is positioned adjacent to two or more process modules so that the mobile transverse chambers can couple or dock with a respective process module.

Each mobile transverse chamber is configured to independently maintain a specified gas condition during conveyance of the substrates. In some embodiments, the gas condition is the pressure inside the mobile transverse chamber. In other embodiments the gas condition is the type of gas environment in the mobile transverse chamber, and for example may include air; inert gas such as Helium (He), Neon (Ne), Argon (Ar), Krypton (Kr), and Xenon (Xe). In yet further embodiments, the gas condition may be comprised of reactive gas(es) such as silane ($SiH_4$), oxygen ($O_2$), dichlorosilane ($SiCl_2H_2$), nitrous oxide ($N_2O$), tetraethylorthosilicate (TEOS; $Si(OC_2H_5)_4$), phosphine ($PH_3$), arsine ($AsH_3$), diborane ($B_2H_6$), and the like, and mixtures thereof.

The pressure inside the mobile transverse chamber may range from vacuum to atmospheric pressure. In one illustrative embodiment, gas is maintained in the mobile transverse chamber at a pressure in the range of about 500 to 1000 mTorr, more usually in the range of 50 to 100 mTorr. In some embodiments the mobile transverse chamber maintains a gas condition such that the difference between the pressure in the mobile transverse chamber and the process module ($\Delta P$) is in the range of about 10 to 50 mTorr. The mobile transverse chambers maintain independently controlled environments, and thus when two mobile transverse chambers are provided, the first mobile transverse chamber may convey substrates at one gas condition such as under vacuum, and the second mobile transverse chamber may convey substrates in a second gas condition such as in an argon atmosphere.

At step 1020, substrates are loaded into at least one of the one or more mobile transverse chambers. In some embodiments, loading substrates into at least one of the mobile transverse chambers can be performed by operating the transport robot assembly 170. In some embodiments, prior to operating the transport robot assembly 170, a flange is used to couple the mobile transverse chamber to a load lock chamber 120 or a processing module 150, 152. In some embodiments, an evacuation pump is used to evacuate the air pocket between the mobile transverse chamber and the load lock chamber or the processing module.

At step 1030, one or more drive systems are actuated to propel at least one of the one or more mobile transverse chambers along the rail. The drive system may include a linear motor, a rack and pinion system, or a pulley and belt system. The drive system is operated to move the mobile transverse chambers along the rail and position the mobile transverse chambers adjacent to a load lock chamber or a respective processing module. In some embodiments, the drive system includes a position sensors or contact sensors to determine the position of the mobile transverse chamber. In some embodiments, the drive system includes a feedback control mechanism to improve the motion and positioning of the mobile transverse chambers.

At step 1040, at least one of the substrates are conveyed from at least one mobile transverse chamber to at least one of the two or more process modules. In some embodiments, substrates are conveyed from the mobile transverse chamber to the process module by operating the transport robot assembly 170. Similar to the loading process at step 1020, a flange may be used to couple the mobile transverse chamber to a processing module 150, 152. In some embodiments, an evacuation pump is used to evacuate the air pocket between the mobile transverse chamber and the load lock chamber or the processing module.

Method of Substrate Transport while Minimizing Heat Loss

Figure 16A:
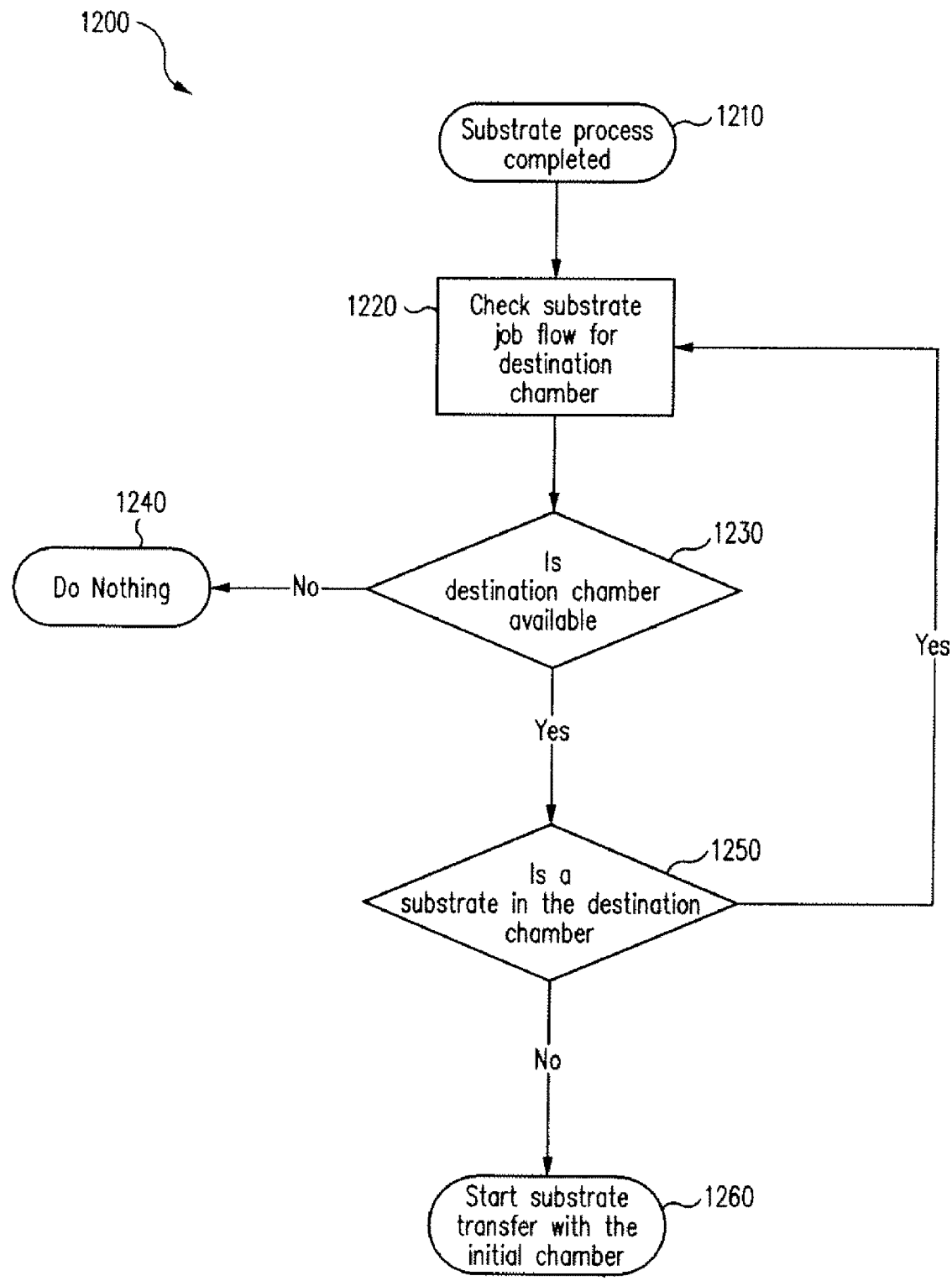
FIGS. 16a and 16b is a flow chart, and block diagram, respectively, illustrating method steps in a docketing and transfer sequence according to some embodiments of the present invention.

In another aspect, a method of transferring a substrate while minimizing heat loss is provided as illustrated generally in the flowchart of FIG. 16a. In some embodiments, a scheduler 1200 is employed to establish operational flow control rules for the transport of one or more substrates.

In some embodiments scheduler 1200 is configured as a state machine. In this example, the primary function of the schedule 1200 is to coordinate the various components of the system 100, thus providing comprehensive operational flow of the substrates throughout processing.

The scheduler 1200 is typically configured to maximize throughput performance of the system 100. However, in the present invention the scheduler 1200 is advantageously configured to promote process consistency, meaning in this context maintaining substantial temperature constancy, or minimizing heat loss, of the substrates while transferring the substrates between processing modules via the mobile transverse chambers. The scheduler 1200 is generally configured to employ forward looking scheduling methods to minimize the amount of time any one substrate is housed in a mobile transverse chamber.

In one embodiment, scheduler 1200 is configured according to the following forward looking rules:

(a) whenever a substrate has completed processing in one of the process chambers, the scheduler will not initiate transfer of the substrate from the process chamber until it can establish or reconcile a transfer path for the substrate within the system 100. This means that no substrate will reside idle in a mobile transverse chamber waiting for the availability of the next processing or transfer station, such as for example the load lock chamber, process module, or any other processing station. Thus, the scheduler is configured such that the scheduler does not initiate a substrate transfer or transport action unless and until there is an open path such that the substrate can be delivered to its next processing or transfer point; and (b) a substrate residing in a process module with the longest processing time has highest priority with respect to substrate transport.

In one example, the above rules may be implemented as illustrated in the flowchart of FIG. 16a which shows one embodiment of transport path reconciliation logic for a processed substrate. At step 1210 the method is initiated upon completion of processing a particular substrate S1 housed in process chamber P1. At step 1220 an inquiry is made regarding the job flow status for substrate S1. Specifically, the next destination location or chamber for substrate S1 is identified. At step 1230 the inquiry is made regarding whether the next destination location or chamber D1 for substrate S1 is available. If no, the substrate S1 remains in process chamber P1 at step 1240. If yes, the inquiry is made regarding whether another substrate S2 is currently located in the destination location or chamber D1 at step 1250. If no, then the scheduler initiates the transport of substrate S from process chamber P1 to destination location or chamber D1 at step 1260. If yes, then the scheduler inquires regarding the job flow status of substrate S2 and the identity of its destination location or chamber D2 at step 1220. While one particular implementation has been described herein, those of skill in the art will recognize that other particular implementations of the forward looking scheduler rules are possible within the scope and teaching of the present invention.

Figure 16B:
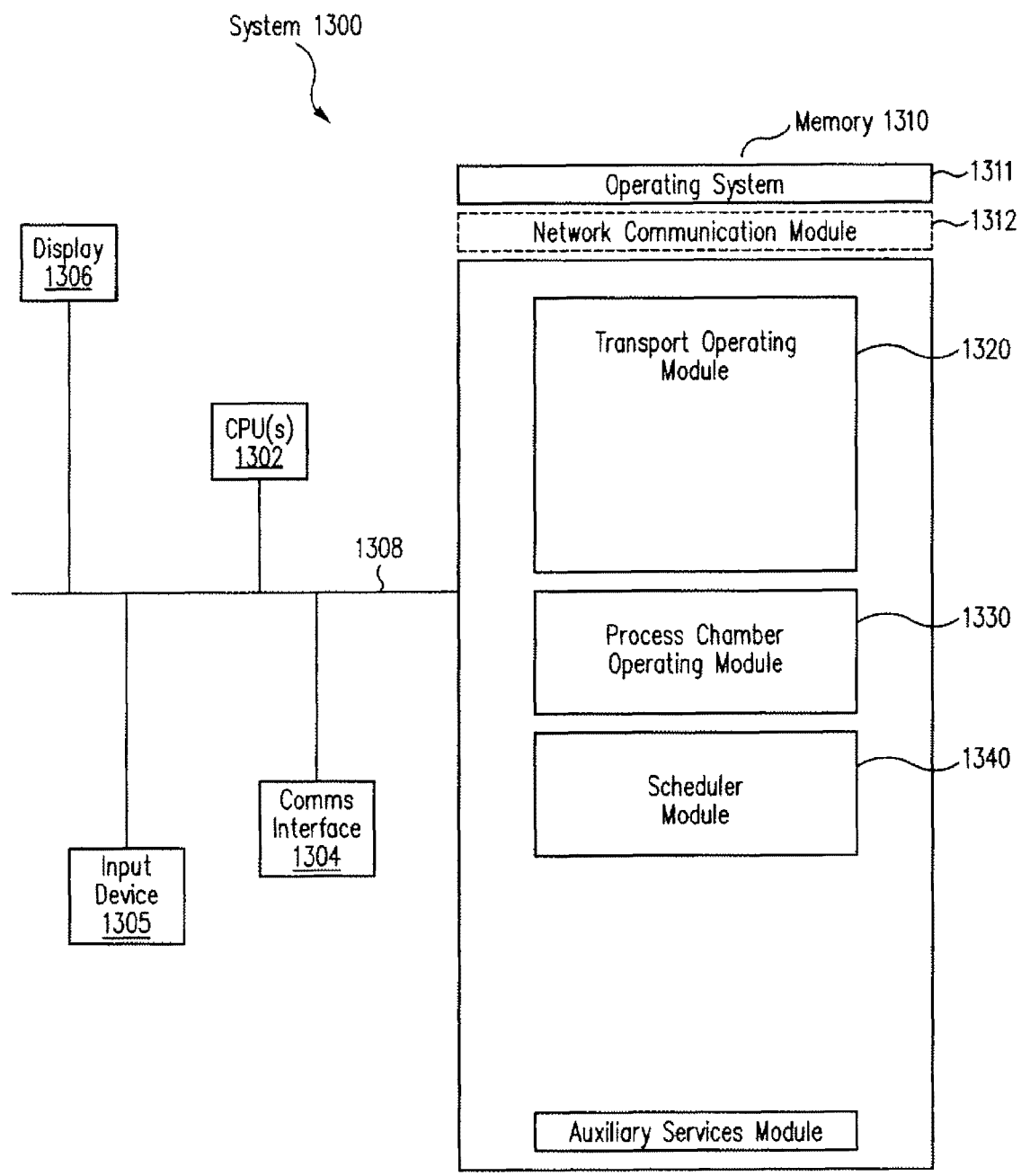

For example, in one illustrative embodiment, a method of transferring one or more substrates between process modules or load lock stations may be carried out as follows: a destination location D1 for a substrate S1 present at an initial processing location P1 is identified. If the destination location D1 is occupied with a substrate S2, the substrate S1 is maintained at the initial processing location P1. If the destination location D1 is available, the substrate S1 is transferred to the destination location D1. Additionally, if the destination D1 is occupied with the substrate S2 the method further comprises the step of identifying a destination location D2 for the substrate S2. In some embodiments, the method further comprises deciding which of the substrates S1 or S2 to transfer first to its respective destination location D1 or D2, based upon which of the substrates S1 or S2 has the longest processing time FIG. 16b is a block diagram of computer system 1300 for controlling the system and implementing the method according to some embodiments of the present invention. The system 1300 generally includes one or more processing units (CPU's) 1302, optionally one or more network or other communications interfaces 1304, memory 1310, and one or more communication buses 1308 for interconnecting these components. The communication buses 1308 may include circuitry (sometimes called a chipset) that interconnects and controls communications between system components. The system 1300 may optionally include a user interface, for instance a display 1306 and an input device 1305. Memory 1310 may include high speed random access memory and may also include non-volatile memory, such as one or more magnetic disk storage devices. Memory 1310 may include mass storage that is remotely located from the central processing unit(s) 1302.

Memory 1310, or alternatively the non-volatile memory device(s) within memory 1310, comprise a computer readable storage medium. In some embodiments, memory 1310 stores the following programs, modules and data structures, or a subset thereof:

an operating system 1311 that includes procedures for handling various basic system services and for performing hardware dependent tasks;

an optional network communication module 1312 that is used for connecting the system 1300 to other computers via the one or more communication network interfaces 1304

(wired or wireless) and one or more communication networks, such as the Internet, other wide area networks, local area networks, metropolitan area networks, and so on;

transport operating modules 1320 that control or manage instructions to transport substrates between load lock station, process modules, and the like, via the mobile transverse chambers, and for loading and unloading of substrates from the mobile transverse chambers, load lock stations and process modules;

process chamber operating module 1330 that controls or manages instructions to control the processing steps and recipes for processing the substrates to form the p-i-n junctions and the like to form the photovoltaic cells; and scheduler module 1340 that that controls or manages instructions to control the hierarchy and path of flow of substrates throughout the system as shown in the flowchart of FIG. 16*a*.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 1310 may store a subset of the modules and data structures identified above. Furthermore, memory 1310 may store additional modules and data structures not described above.

Although FIG. 16*b* shows a "system," FIG. 16*b* is intended more as functional description of the various features that may be present in a set of processors (e.g., in clients or in servers) than as a structural schematic of the embodiments described herein. In practice, and as recognized by those of ordinary skill in the art, items shown separately could be combined and some items could be separated. For example, some items shown separately in FIG. 16*b* could be implemented on single servers and single items could be implemented by one or more servers. The actual number of resources used to implement a system and how features are allocated among them will vary from one implementation to another.

The method may be governed by instructions that are stored in a computer readable storage medium and that are executed by one or more processors of one or more servers. Each of the operations shown in FIG. 16*a* and FIG. 16*b* may correspond to instructions stored in a computer memory or computer readable storage medium. The computer readable storage medium may include a magnetic or optical disk storage device, solid state storage devices such as Flash memory, or other non-volatile memory device or devices. The computer readable instructions stored on the computer readable storage medium are in source code, assembly language code, object code, or other instruction format that is interpreted by one or more processors.

Process Chamber Integrated Facility

Figure 17:
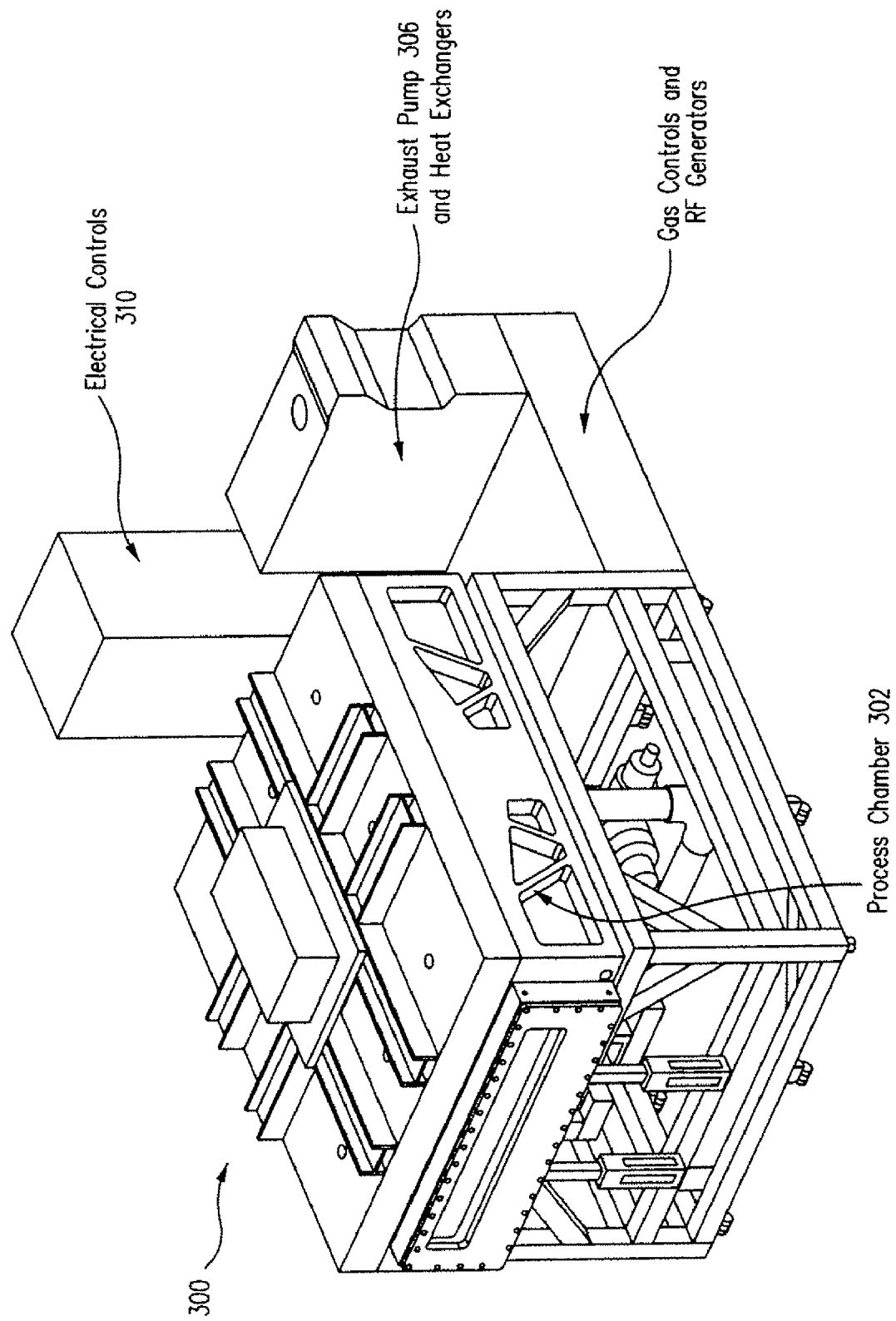
FIG. 17 depicts a perspective view of a process module with integrated associated system components according to some embodiments of the present invention.

In another aspect of the present invention, a process module facility 300 is provided having integrated facilities as illustrated in FIG. 17. In one embodiment, the process module facility generally comprises process chamber 302 carried in frame 304, subfloor 306, and process chamber pump 308. Subfloor 306 houses gas control lines and other piping (not shown). Process chamber pump 308 is preferably located in adjacent the process chamber 302 and is coupled to the process chamber 302 via gas control lines in subfloor 306. Optionally, and additionally, electrical controls 310 may be housed adjacent the process chamber and coupled to the process chamber via electrical wires (not shown) housed in the subfloor 306. This is of particular advantage with existing semiconductor fabs since the integrated facility 300 of the present invention is modular and flexible, and may be easily incorporated in existing fabs the generally sit on concrete slabs.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings and in the spirit of the invention. The specific embodiments described herein were chosen and described in order to best explain the principles of the invention and its practical applications, to thereby enable others skilled in the art to best utilize the invention and various embodiments with various modifications as are suited to the particular use contemplated.

What is claimed is:

1. A method for transferring a substrate to two or more process modules, comprising:

loading at least one substrate into one or more mobile transverse chambers, the mobile transverse chambers being carried on a rail positioned adjacent to the two or more process modules, and wherein each mobile transverse chamber is configured to maintain a specified gas condition during conveyance of the substrate;

actuating one or more drive systems to propel the one or more mobile transverse chambers along the rail;

docking the mobile transverse chamber to at least one of the process modules; and conveying the at least one substrate from the mobile transverse chamber to the at least one process modules, wherein the step of conveying the substrate further comprises: supporting the substrate on a substrate holder; and moving the substrate holder between a retracted position and an extended position;

and wherein a swing arm mechanism moves the substrate holder between the retracted and extended positions.

2. The method of claim 1 further comprising:

evacuating the mobile transverse chamber after the docking step.

3. The method of claim 1 further comprising:

evacuating an air pocket formed between the process module and the mobile transverse chamber after the docking step and prior to the conveying step.

4. The method of claim 1 wherein the substrate is conveyed from the mobile transverse chamber to the at least one process module in a horizontal configuration.

5. The method of claim 1 further comprising: depositing a P-type layer of silicon on the substrate.

6. The method of claim 1 further comprising: depositing a N-type layer of silicon on the substrate.

7. The method of claim 1 further comprising: depositing I-type silicon on the substrate.

8. The method of claim 1, wherein each of the one or more mobile transverse chambers is configured to independently maintain a specified gas condition.

9. The method of claim 8, wherein the gas condition comprises the type of gas, or the pressure of gas, in the mobile transverse chamber.

10. The method of claim 8 wherein the mobile transverse chamber is configured to maintain gas at a pressure in the range of about 50 mTorr to 1 Torr.

11. The method of claim 1, further comprising: heating at least one of the mobile transverse chambers.

12. The method of claim 1 further comprising: cooling the at least one substrate after depositing a layer of material on the surface of the substrate.

13. The method of claim 1 wherein the step of docking further comprises:
actuating cylinder clamps that engage and seal surfaces on the mobile transverse chamber and process module.

14. The method of claim 1, wherein the swing arm mechanism further comprises a swing arm and a slide with a channel formed therein; and one end of the swing arm moves linearly within the channel and the other end of the swing arm pivots about a fixed post.

15. The method of claim 1, further comprising: pre-heating the at least one substrate prior to the loading step.

16. The method of claim 1, wherein the mobile transverse chamber is configured to maintain a gas condition such that the difference in pressure between the mobile transverse chamber and the process module is in the range of about 10 to 500 mTorr.

17. A method for transferring a substrate to two or more process modules, comprising:
loading at least one substrate into one or more mobile transverse chambers, the mobile transverse chambers being carried on a rail positioned adjacent to the two or more process modules, and wherein each mobile transverse chamber is configured to maintain a specified gas condition during conveyance of the substrate;
actuating one or more drive systems to propel the one or more mobile transverse chambers along the rail;
docking the mobile transverse chamber to at least one of the process modules; and
conveying the at least one substrate from the mobile transverse chamber to the at least one process module in a vertical configuration.

18. The method of claim 17 wherein two substrates are conveyed in pairs.

19. The method of claim 17 wherein the step of conveying the substrate further comprises: supporting the substrate on a substrate holder; and moving the substrate holder between a retracted position and an extended position.

20. The method of claim 19, wherein a swing arm mechanism moves the substrate holder between the retracted and extended positions.

21. The method of claim 20 wherein the swing arm mechanism further comprises a swing arm and a slide with a channel formed therein; and one end of the swing arm moves linearly within the channel and the other end of the swing arm pivots about a fixed post.

22. The method of claim 17, further comprising: pre-heating the at least one substrate prior to the loading step.

23. The method of claim 17, wherein the mobile transverse chamber is configured to maintain a gas condition such that the difference in pressure between the mobile transverse chamber and the process module is in the range of about 10 to 500 mTorr.

24. The method of claim 17, further comprising:
evacuating the mobile transverse chamber after the docking step.

25. The method of claim 17, further comprising:
evacuating an air pocket formed between the process module and the mobile transverse chamber after the docking step and prior to the conveying step.

26. The method of claim 17, wherein the substrate is conveyed from the mobile transverse chamber to the at least one process module in a horizontal configuration.

27. The method of claim 17, further comprising: depositing a P-type layer of silicon on the substrate.

28. The method of claim 17, further comprising: depositing a N-type layer of silicon on the substrate.

29. The method of claim 17, further comprising: depositing I-type silicon on the substrate.

30. The method of claim 17, wherein each of the one or more mobile transverse chambers is configured to independently maintain a specified gas condition.

31. The method of claim 30, wherein the gas condition comprises the type of gas, or the pressure of gas, in the mobile transverse chamber.

32. The method of claim 30, wherein the mobile transverse chamber is configured to maintain gas at a pressure in the range of about 50 mTorr to 1 Torr.

33. The method of claim 17, further comprising: heating at least one of the mobile transverse chambers.

34. The method of claim 17, further comprising: cooling the at least one substrate after depositing a layer of material on the surface of the substrate.

35. The method of claim 17, wherein the step of docking further comprises:
actuating cylinder clamps that engage and seal surfaces on the mobile transverse chamber and process module.

36. A method for transferring a substrate to two or more process modules, comprising:
pre-heating at least one substrate;
loading the pre-heated at least one substrate into one or more mobile transverse chambers, the mobile transverse chambers being carried on a rail positioned adjacent to the two or more process modules, and wherein each mobile transverse chamber is configured to maintain a specified gas condition during conveyance of the substrate;
actuating one or more drive systems to propel the one or more mobile transverse chambers along the rail;
docking the mobile transverse chamber to at least one of the process modules; and
conveying the at least one substrate from the mobile transverse chamber to the at least one process modules.

37. The method of claim 36, further comprising:
evacuating the mobile transverse chamber after the docking step.

38. The method of claim 36, further comprising:
evacuating an air pocket formed between the process module and the mobile transverse chamber after the docking step and prior to the conveying step.

39. The method of claim 36, wherein the substrate is conveyed from the mobile transverse chamber to the at least one process module in a horizontal configuration.

40. The method of claim 36, further comprising: depositing a P-type layer of silicon on the substrate.

41. The method of claim 36, further comprising: depositing a N-type layer of silicon on the substrate.

42. The method of claim 36, further comprising: depositing I-type silicon on the substrate.

43. The method of claim 36, wherein each of the one or more mobile transverse chambers is configured to independently maintain a specified gas condition.

44. The method of claim 43, wherein the gas condition comprises the type of gas, or the pressure of gas, in the mobile transverse chamber.

45. The method of claim 43, wherein the mobile transverse chamber is configured to maintain gas at a pressure in the range of about 50 mTorr to 1 Torr.

46. The method of claim 36, further comprising: heating at least one of the mobile transverse chambers.

47. The method of claim 36, further comprising: cooling the at least one substrate after depositing a layer of material on the surface of the substrate.

48. The method of claim 36, wherein the mobile transverse chamber is configured to maintain a gas condition such that the difference in pressure between the mobile transverse chamber and the process module is in the range of about 10 to 500 mTorr.

49. The method of claim 36, wherein the step of docking further comprises:
   actuating cylinder clamps that engage and seal surfaces on the mobile transverse chamber and process module.

50. A method for transferring a substrate to two or more process modules, comprising:
   loading at least one substrate into one or more mobile transverse chambers, the mobile transverse chambers being carried on a rail positioned adjacent to the two or more process modules, and wherein each mobile transverse chamber is configured to maintain a specified gas condition during conveyance of the substrate;
   actuating one or more drive systems to propel the one or more mobile transverse chambers along the rail;
   docking the mobile transverse chamber to at least one of the process modules; and
   conveying the at least one substrate from the mobile transverse chamber to the at least one process modules,
   wherein the mobile transverse chamber is configured to maintain a gas condition such that the difference in pressure between the mobile transverse chamber and the process module is in the range of about 10 to 500 mTorr.

51. The method of claim 50, further comprising:
   evacuating the mobile transverse chamber after the docking step.

52. The method of claim 50, further comprising:
   evacuating an air pocket formed between the process module and the mobile transverse chamber after the docking step and prior to the conveying step.

53. The method of claim 50, wherein the substrate is conveyed from the mobile transverse chamber to the at least one process module in a horizontal configuration.

54. The method of claim 50, further comprising: depositing a P-type layer of silicon on the substrate.

55. The method of claim 50, further comprising: depositing a N-type layer of silicon on the substrate.

56. The method of claim 50, further comprising: depositing I-type silicon on the substrate.

57. The method of claim 50, wherein each of the one or more mobile transverse chambers is configured to independently maintain a specified gas condition.

58. The method of claim 57, wherein the gas condition comprises the type of gas, or the pressure of gas, in the mobile transverse chamber.

59. The method of claim 57, wherein the mobile transverse chamber is configured to maintain gas at a pressure in the range of about 50 mTorr to 1 Torr.

60. The method of claim 50, further comprising: heating at least one of the mobile transverse chambers.

61. The method of claim 50, further comprising: cooling the at least one substrate after depositing a layer of material on the surface of the substrate.

62. The method of claim 50, wherein the step of docking further comprises:
   actuating cylinder clamps that engage and seal surfaces on the mobile transverse chamber and process module.

* * * * *